(12) United States Patent
Gopalakrishnan et al.

(10) Patent No.: US 11,036,582 B2
(45) Date of Patent: Jun. 15, 2021

(54) UNCORRECTABLE ERROR CORRECTION CODE (UECC) RECOVERY TIME IMPROVEMENT

(71) Applicant: Western Digital Technologies, Inc., San Jose, CA (US)

(72) Inventors: Raghavendra Gopalakrishnan, Bangalore (IN); Bhanushankar Doni, Bangalore (IN); Manohar Srinivasaiah, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 59 days.

(21) Appl. No.: 16/585,503

(22) Filed: Sep. 27, 2019

(65) Prior Publication Data

US 2021/0096948 A1    Apr. 1, 2021

(51) Int. Cl.
*G06F 11/10* (2006.01)
*G11C 16/10* (2006.01)
*G11C 11/56* (2006.01)
*G11C 16/26* (2006.01)
*G11C 16/04* (2006.01)

(52) U.S. Cl.
CPC ...... *G06F 11/1068* (2013.01); *G11C 11/5628* (2013.01); *G11C 11/5671* (2013.01); *G11C 16/10* (2013.01); *G11C 16/26* (2013.01); *G11C 16/0483* (2013.01)

(58) Field of Classification Search
CPC ............. G06F 11/1068; G11C 11/5628; G11C 11/5671; G11C 16/10; G11C 16/26; G11C 16/0483
See application file for complete search history.

(56) References Cited

U.S. PATENT DOCUMENTS

| | | | |
|---|---|---|---|
| 8,130,552 B2 | 3/2012 | Miwa et al. | |
| 8,788,908 B2 | 7/2014 | Yoon et al. | |
| 9,136,022 B2 | 9/2015 | Raghu et al. | |
| 9,152,497 B2 | 10/2015 | Lee et al. | |
| 9,183,086 B2 | 11/2015 | Avila et al. | |
| 9,223,648 B2 | 12/2015 | Liang et al. | |
| 9,229,644 B2 | 1/2016 | Ng et al. | |
| 9,390,774 B2 | 7/2016 | Sharon et al. | |
| 9,530,491 B1 * | 12/2016 | Uttarwar | G06F 12/0246 |
| 9,569,143 B1 * | 2/2017 | Sehgal | G11C 16/344 |
| 9,703,629 B2 | 7/2017 | Desireddi et al. | |

(Continued)

*Primary Examiner* — Guy J Lamarre
(74) *Attorney, Agent, or Firm* — Vierra Magen Marcus LLP

(57) ABSTRACT

An apparatus comprising non-volatile memory is configured to access a selected unit of encoded SLC data in the non-volatile memory during a first programming phase of a process of folding data stored at a single bit per memory cell to data stored at multiple bits per memory cell. The apparatus recovers the selected unit of SLC data based on redundancy data formed from units of SLC data that data include the selected unit of SLC data. The apparatus saves the recovered selected unit of SLC data to memory. The apparatus uses the saved recovered unit of SLC data during a second programming phase of folding the data stored at a single bit per memory cell to the data stored at multiple bits per memory cell, thereby saving considerable time in not having to again recover the SLC data using the redundancy data.

18 Claims, 20 Drawing Sheets

(56) References Cited

U.S. PATENT DOCUMENTS

| | | | |
|---|---|---|---|
| 2011/0149651 A1* | 6/2011 | Gorobets | G11C 16/0483 365/185.03 |
| 2012/0311244 A1* | 12/2012 | Huang | G11C 16/0483 711/103 |
| 2015/0149693 A1* | 5/2015 | Ng | G11C 16/10 711/103 |
| 2015/0332759 A1 | 11/2015 | Huang et al. | |
| 2019/0163620 A1* | 5/2019 | Muthiah | G06F 3/064 |

* cited by examiner

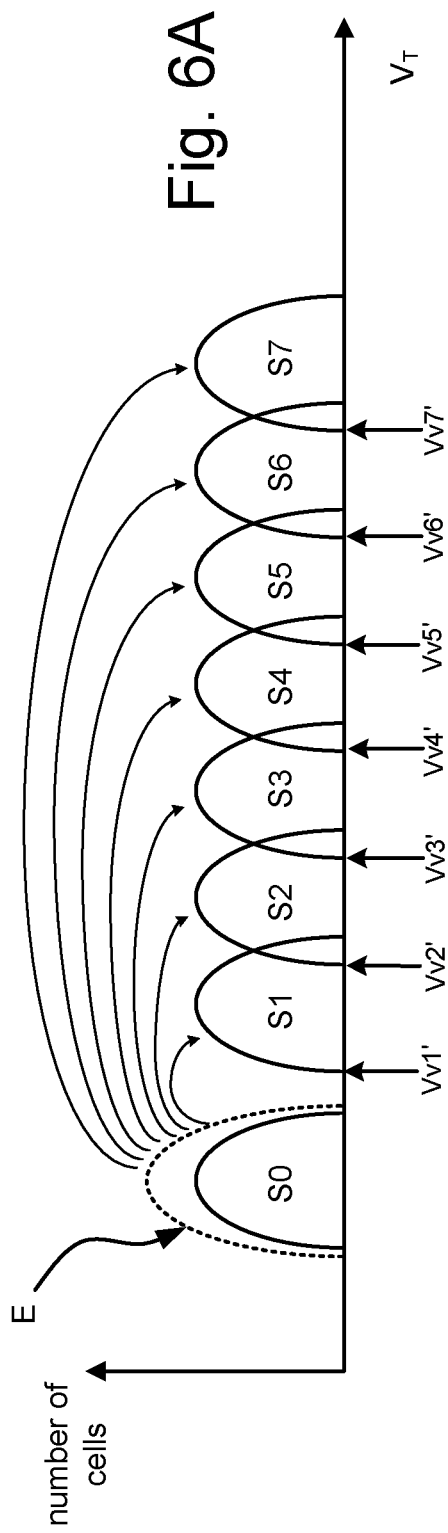
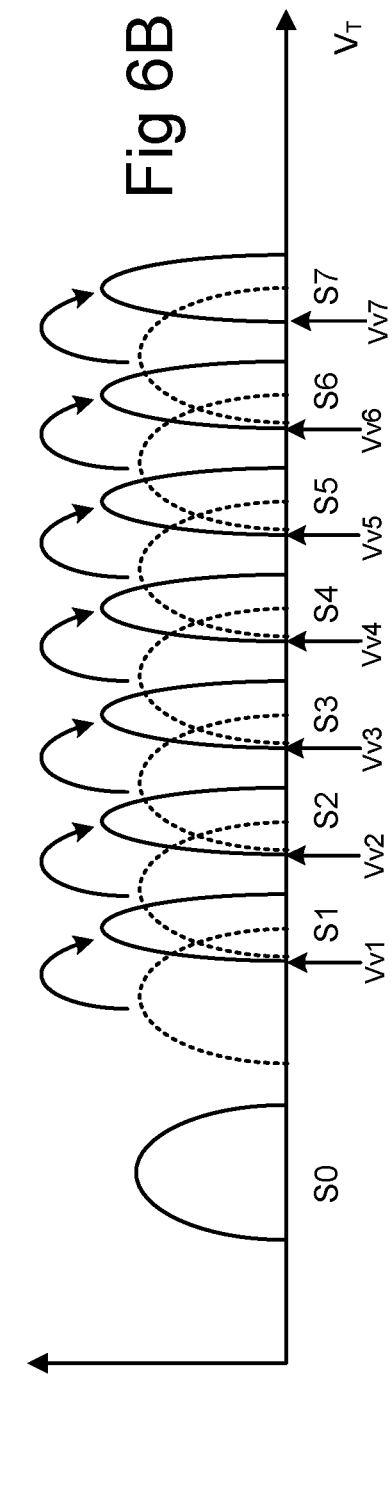

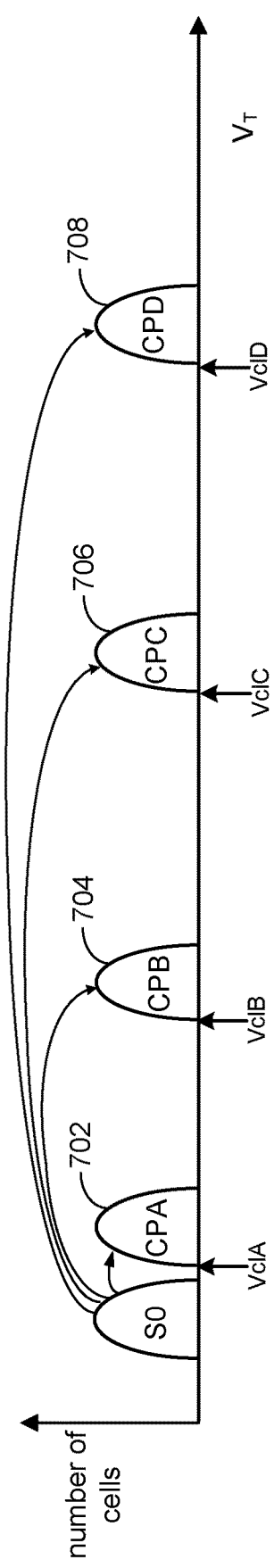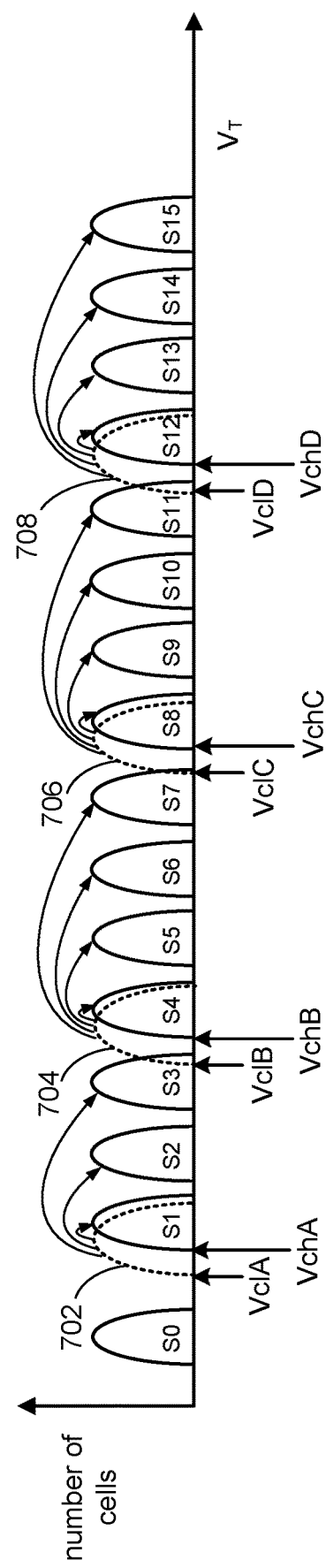

1400

Save the recovered UECC page in volatile memory cells in memory controller ⟵ 1402

Access the recovered UECC page that was stored in volatile memory cells in memory controller ⟵ 1404

Save the recovered UECC page in non-volatile memory cells in memory structure ⟵ 1502

Access the recovered UECC page that was stored in non-volatile memory cells in the memory structure ⟵ 1504

FIG. 15

UNCORRECTABLE ERROR CORRECTION CODE (UECC) RECOVERY TIME IMPROVEMENT

BACKGROUND

Many electronic devices make use of an embedded or otherwise connected storage devices. Often, the embedded or connected storage device includes non-volatile memory. A host refers to a device that makes use of a storage device. A host can be connected to the storage device, or the storage device can be embedded within the host. Examples of host systems include smartphones, laptops, desktop computers, servers, smart appliances, digital cameras, video cameras, etc.

A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. One example of a storage device that uses semiconductor based non-volatile memory is a solid state device ("SSD").

Non-volatile storage devices, such as SSDs, have become more popular and are now being used with more applications. Users of SSDs and other storage devices desire high performance (e.g., fast write and read operation times).

BRIEF DESCRIPTION OF THE DRAWINGS

Like-numbered elements refer to common components in the different Figures.

FIGS. 6A and 6B described one example of a multi-pass programming process, referred to as Coarse-Fine Programming.

FIGS. 7A and 7B depict one embodiment that can be used during a coarse program phase.

FIG. 14 is a flowchart describing one embodiment of a process in which the recovered UECC page is stored in volatile memory in the memory controller.

FIG. 15 is a flowchart describing one embodiment of a process in which the recovered UECC page is stored in volatile memory in non-volatile memory cells in the memory structure.

DETAILED DESCRIPTION

Figure 1A:
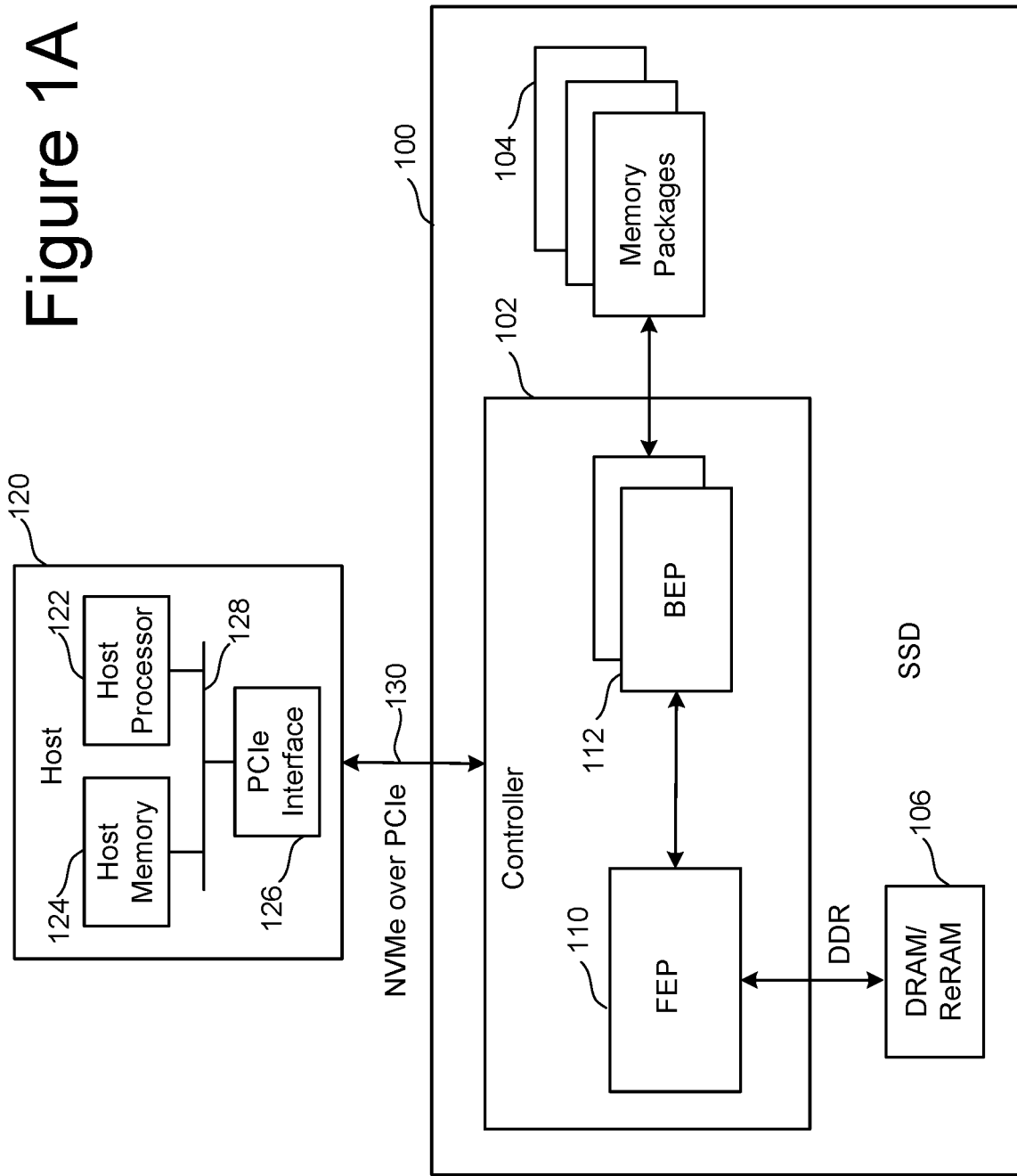
FIG. 1A is a block diagram of one embodiment of a storage device connected to a host.

Techniques are disclosed herein for operating non-volatile storage. The basic unit of storage in non-volatile storage systems is a memory cell. In some embodiments, memory cells store one bit of data and are referred to as Single Level Cells ("SLC"). An SLC memory cell can either be in an erased data state or a programmed data state. In other embodiments, memory cells store multiple bits of data and are referred to as Multi Level Cells ("MLC"). MLC memory cells can store two bits of data per memory cell, three bits of data per memory cell, four bits of data per memory cell, etc. An MLC memory cell can be in an erased data state or any one of multiple programmed data states. For example, an MLC memory cell that stores three bits of data (referred to as a three level cell—TLC), can be in an erased data state or any one of seven programmed data states. Because SLC memory cells only have two valid data states (erased and programmed), there is more margin between data states and less precision is required; therefore, SLC memory cells can be operated faster. MLC memory cells are typically operated slower so that they can be more precisely programmed into any one of multiple programmed data states.

To increase performance experienced by a user, some storage devices will first program data into SLC memory cells. Subsequently, in the background or when the storage device is idle, the storage device will re-write the data from the SLC memory cells to MLC memory cells, which allows the data to be stored more compactly so that the storage device is able to store more data. This process of moving the data from SLC memory cells to MLC memory cells is referred to herein as a folding SLC data to MLC data. Techniques disclosed herein improve performance time when folding data from SLC to MLC. In one embodiment, when folding the data to MLC memory cells, the programming operation has multiple phases. For example, the programming operation may have a coarse phase and a fine phase, which are discussed in more detail below. In some embodiments, after the coarse phase of programming a first unit of MLC data into first MLC memory cells on one word line in a block of MLC memory cells, a second unit of MLC data may be programming into second MLC memory cells on another word line in the block of MLC memory cells. This may cause the first unit of MLC data and its associated SLC data to be lost in various latches, registers, or volatile memory that temporarily stores the first unit of MLC data and its associated SLC data. Thus, the SLC memory cells may be read again during the fine phase in order to complete the programming of the MLC data.

In one embodiment, both SLC data and MLC data are encoded into what are referred to as "codewords" prior to storage. In one embodiment, Error Correction Codes (ECC) are used to protect SLC data from corruption. In one embodiment, the ECC are "systematic," in that the SLC data portion of the eventual codeword is unchanged from the actual SLC data being encoded, with the ECC bits appended to the SLC data bits to form the complete codeword. Other techniques can be used that map SLC data to a codeword in more complex manners. For example, low density parity check (LDPC) codes, also referred to as Gallager codes, can be used. In either case, an ECC algorithm may be used to decode the codeword and to correct any errors in the SLC data. It is possible that the error correcting algorithm is unable to correct all errors in the SLC data, which is referred herein as a UECC failure. As a backup, redundancy data may be used to recover in the event a page is un-correctable by the ECC algorithm. In other words, redundancy data may be used to recover the SLC data in the event that the ECC algorithm was not able to decode the codeword for the SLC data.

Herein, the term redundancy data in connection with SLC data is data that is formed from multiple units of SLC data, and that may be used to recover any given unit of SLC data that was used to form the redundancy data. The recovery of a given unit of SLC data is made from the redundancy data and the other units of SLC data that were used to form the redundancy data. However, it is possible to decode or otherwise interpret each of the codewords of SLC data without the redundancy data. For example, each codeword of the SLC data could possibly be decoded or otherwise interpreted by executing an ECC algorithm on the SLC codeword. Hence, in this sense the redundancy data is redundant. The redundancy data is not merely a copy of either the SLC data or a codeword formed from the SLC data.

In some embodiments, the redundancy data is formed by accumulating a bitwise exclusive OR (XOR) based on pages of SLC data. For example, a bitwise XOR is performed on two pages of SLC data to produce an intermediate result, then a bitwise XOR is performed on the intermediate result and another page of SLC data, etc. The XOR operation may be considered to be an addition modulo 2 operation (i.e., summing bits and taking the least significant bit as the output). The redundancy data does not require that each page of SLC data be stored twice. In one embodiment, a single page of redundancy data can be used to recover any one of the SLC pages from which the redundancy data was formed. Further details of using redundancy data are described in U.S. Pat. No. 9,183,086 to Avila et al., entitled "Selection of Data for Redundancy Calculation in Three Dimensional Nonvolatile Memory, which is incorporated herein by reference in its entirety.

However, the process of using the redundancy data to recover the SLC data may be very time consuming. Also, it is possible that the UECC failure could occur to the same unit of SLC data multiple times during a folding operation. Embodiments disclosed herein avoid the need to repeatedly use the redundancy data to recover the SLC data in the event that the UECC failure occurs repeatedly. In some embodiments, after using the redundancy data to recover the SLC data during a coarse phase of a folding operation, a recovered version of the SLC data is preserved. The recovered version of the SLC data may be preserved even if the rest of the SLC data that is being folded to MLC memory cells is lost due to, for example, another folding operation that involves different SLC data overwriting the first SLC data.

FIG. 1A is a block diagram of one embodiment of a storage device 100 connected to a host 120. Storage device 100 can implement the technology proposed herein. Many different types of storage devices can be used with the technology proposed herein. One example storage device is a solid state device (SSD); however, other types of storage devices can also be used. Storage device 100 comprises a Controller 102, non-volatile memory 104 for storing data, and local memory (e.g. DRAM/ReRAM) 106. In one embodiment, local memory 106 is optional. Controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip (SoC). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction, control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with storage device 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from storage device 100. In one embodiment, storage device 100 is embedded in host 120. Any combination of one or more of storage device 100, controller 102, FEP 110, BEP 112, and/or memory packages 104 may be referred to herein as an apparatus.

Figure 1B:
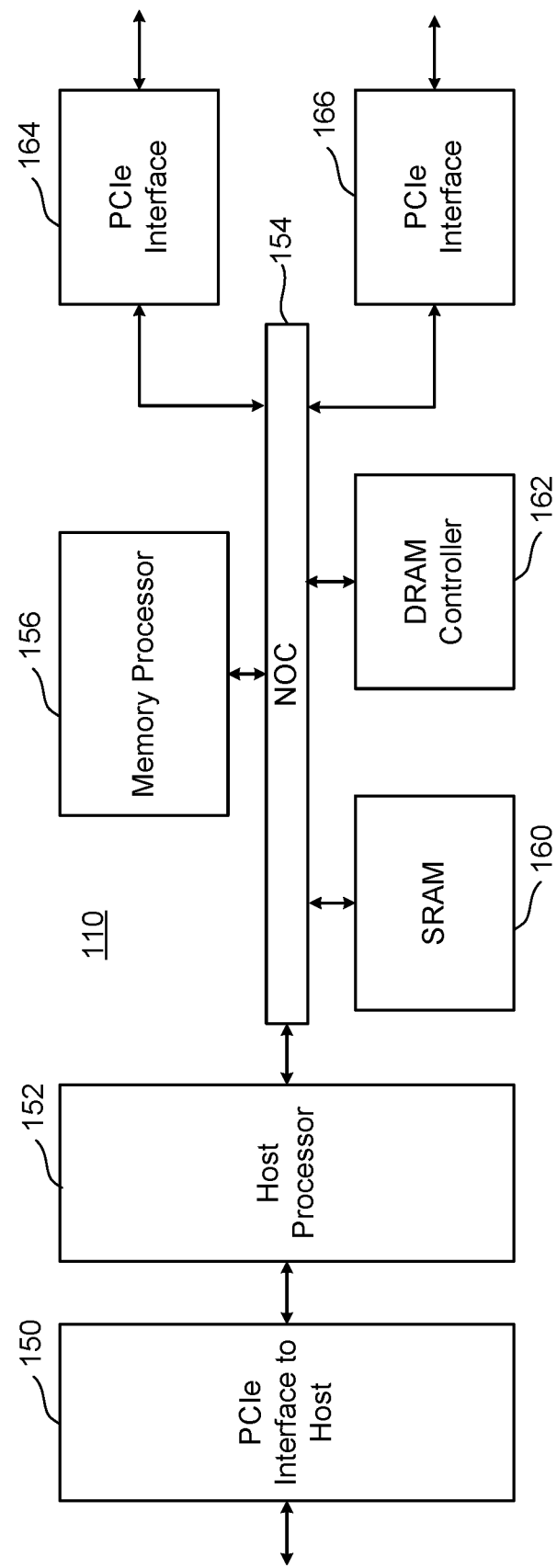
FIG. 1B is a block diagram of one embodiment of a Front End Processor Circuit. In some embodiments, the Front End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
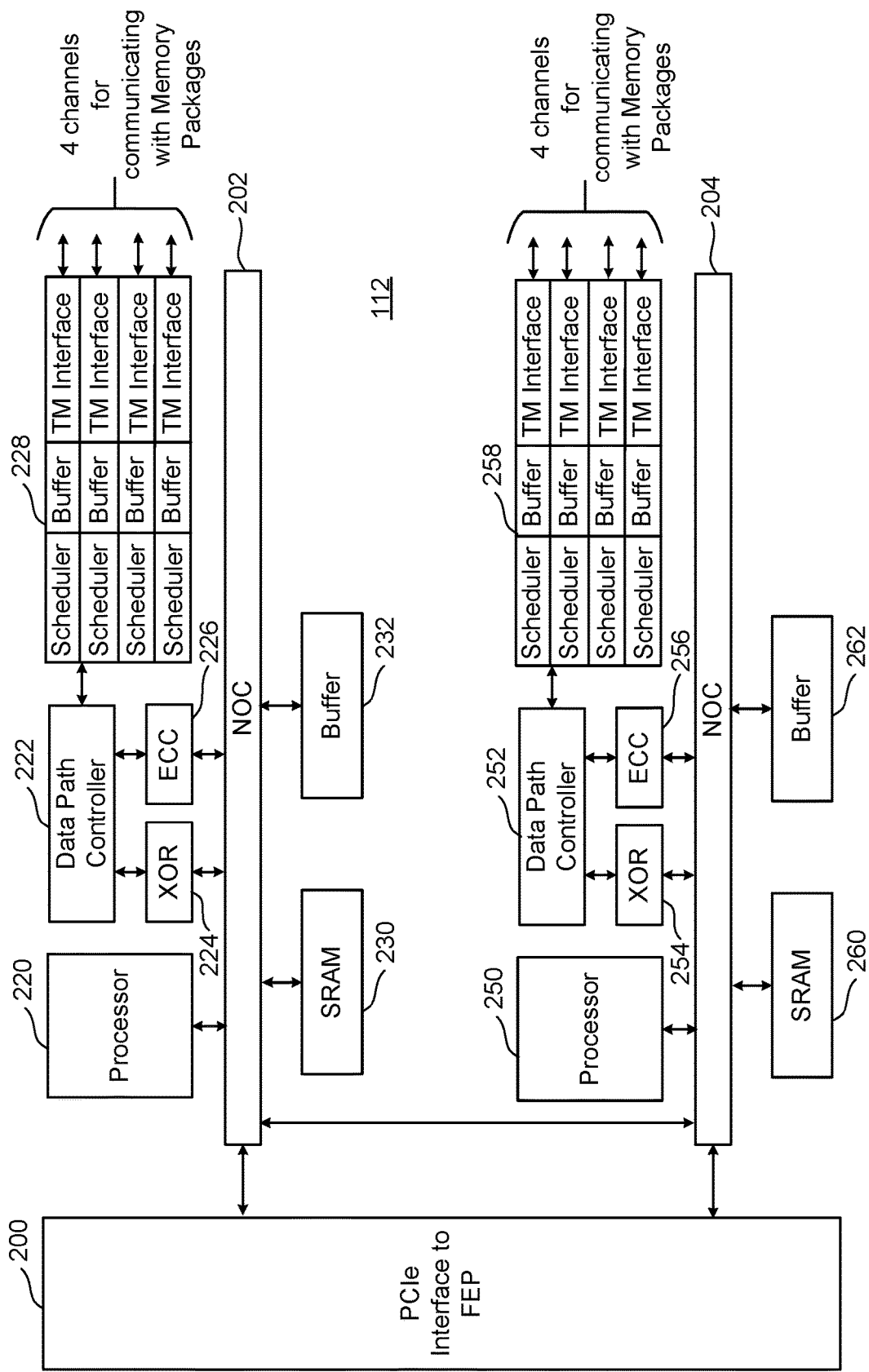
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs (Network-on-a-Chip) 202 and 204. In one embodiment, the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a UECC failure. In an embodiment, XOR engines 224/254 form a bitwise XOR of different pages of data. The XOR result may be stored in a memory package 104. In the event that an ECC engine 226/256 is unable to successfully correct all errors in a page of data that is read back from a memory package 104, the stored XOR result may be accessed from the memory package 104. The page of data may then be recovered based on the stored XOR result, along with the other pages of data that were used to form the XOR result.

Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Interfaces 228/258, alone or in combination, may be referred to as a memory interface configured to be connected to non-volatile memory (e.g., memory package 104). A combination of one or more of processor 220/250, data path controller 222/252, XOR 224/254, ECC 226/256 may be referred to herein as a processor circuit. The buffer 232/262, SRAM 230/260, and/or NOCs 202/204 may also be considered to be a part of the processor circuit.

Figure 1D:
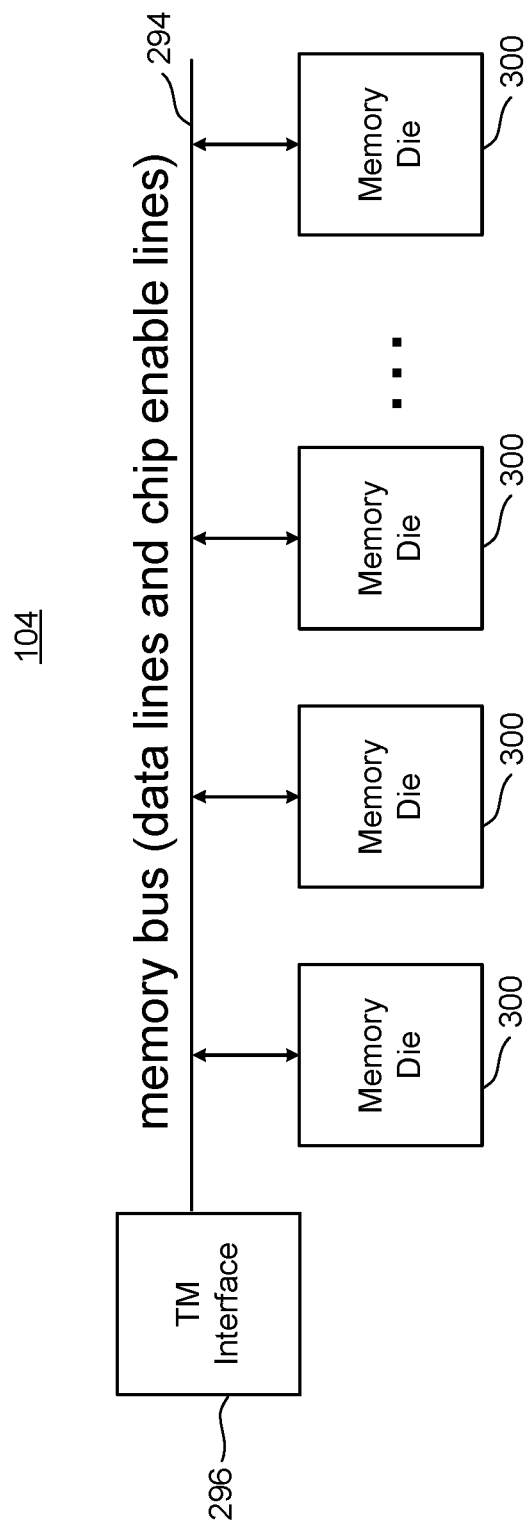
FIG. 1D is a block diagram of one embodiment of a memory package.

FIG. 1D is a block diagram of one embodiment of a memory package 104 that includes a plurality of memory die 300 connected to a memory bus (data lines and chip enable lines) 294. The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2:
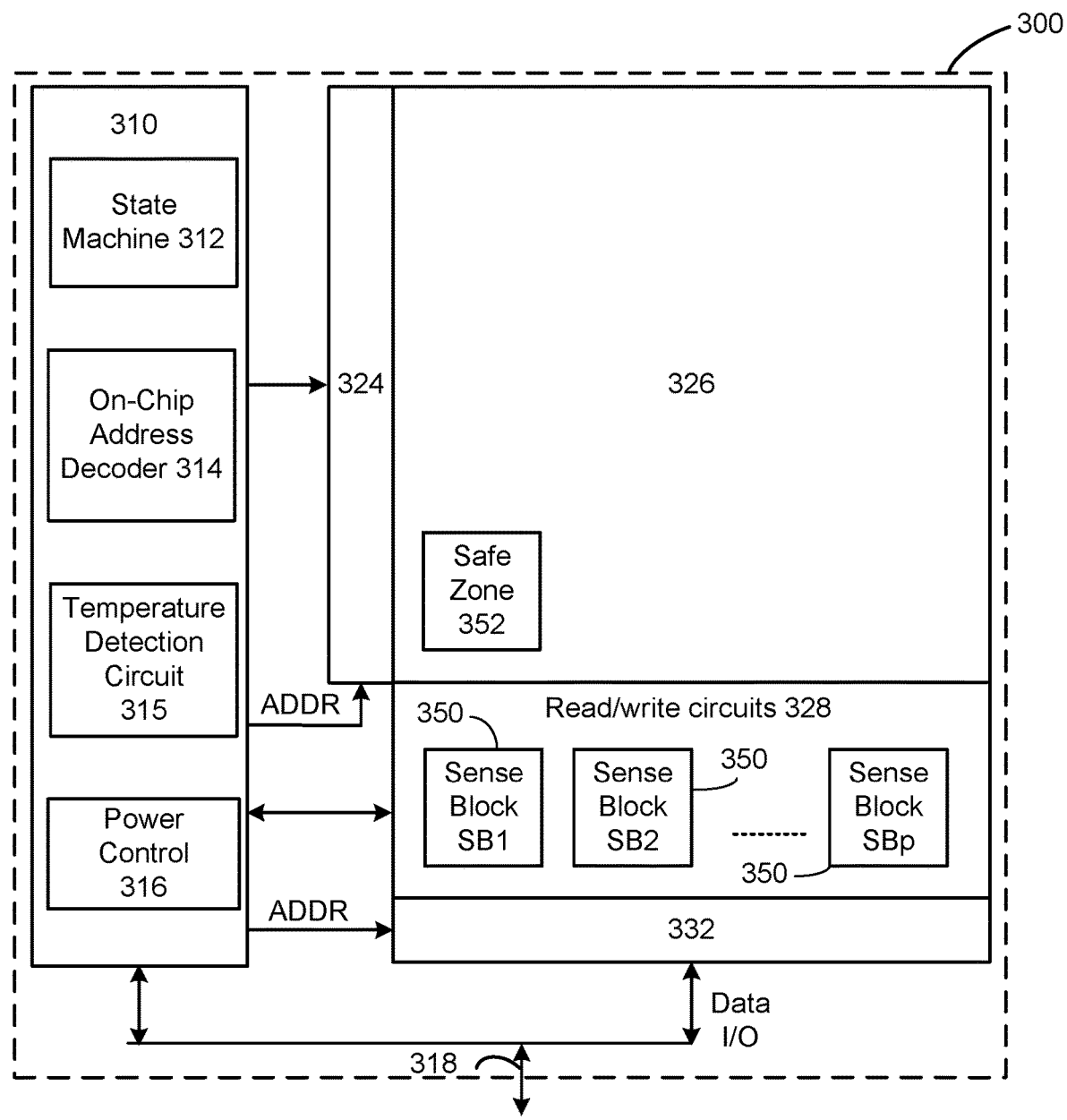
FIG. 2 is a block diagram of one embodiment of a memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory die interface 318. Examples of memory die interface 318 include a Toggle Mode Interface and an Open NAND Flash Interface (ONFI). Other I/O interfaces can also be used.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. The default values and other parameters could be stored in a region of the memory structure 326, such as safe zone 352. The safe zone 352 is not used for storing user data. Safe zone 352 comprises one or more blocks of non-volatile memory cells that are reserved for storing information for managing operation of the memory structure 326. In one embodiment, the safe zone 352 is used to store a page (or other unit of data) that was recovered following a UECC failure.

The temperature detection circuit 315 is configured to measure temperature on the memory die 300. The memory die 300 reports temperature information to the memory controller 102. In some embodiments, the memory controller 102 is configured to regulate the temperature of the storage device 100. Operating the storage device 100 at a temperature above a critical temperature may result in failure of the storage device 100 to retain data or otherwise operate properly. Therefore, to prevent that from happening, in embodiments that monitor temperature of the storage device 100, or monitor temperature of one or more portions or components of the storage device 100 (e.g., using temperature detection circuit 315 on memory dies 300), a threshold temperature that is below the critical temperature is used as threshold temperature. In some embodiments that measure temperature at more than one location within the storage device, e.g., by measuring temperature of two or more memory die 300, the highest measured temperature of the two or more portions or components of the storage device is used as the measured temperature. In some other embodiments, an average or other combination of the measured temperatures of the two or more portions or components of the storage device 100 is used as the measured temperature.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102 (or other controller), which is an electrical circuit in combination with software (e.g., firmware), that performs the functions described below in the flow charts. In one embodiment, the control circuit is the controller where the controller is an electrical circuit that does not use hardware. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate the non-volatile memory.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
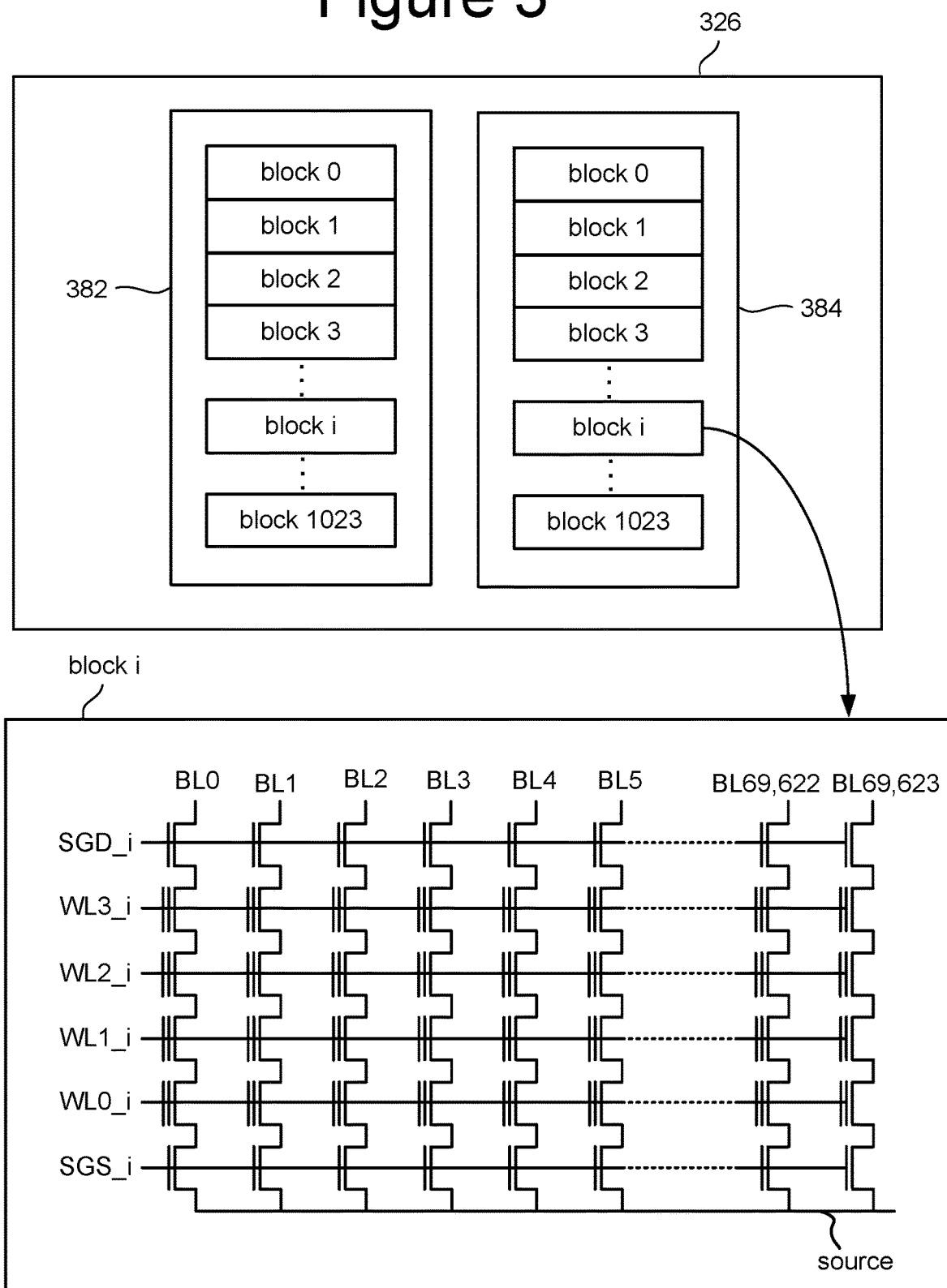
FIG. 3 is a block diagram that depicts details of a non-volatile memory structure.

FIG. 3 depicts an example of memory structure 326. In one embodiment, memory structure 326 is an array of memory cells divided into multiple planes. In FIG. 3, memory structure 326 is divided into two planes: plane 382 and plane 384. In other embodiments, more or fewer than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 326. As used herein, a memory erase block is a contiguous set of memory cells that share word lines and bit lines; for example, erase block i of FIG. 3 includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 3 shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 3 shows 69,624 bit lines, a different number of bit lines can also be used.

Each memory erase block and/or each memory unit is typically divided into a number of pages. In one embodiment, a page is a unit of programming and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the page. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

Figure 4A:
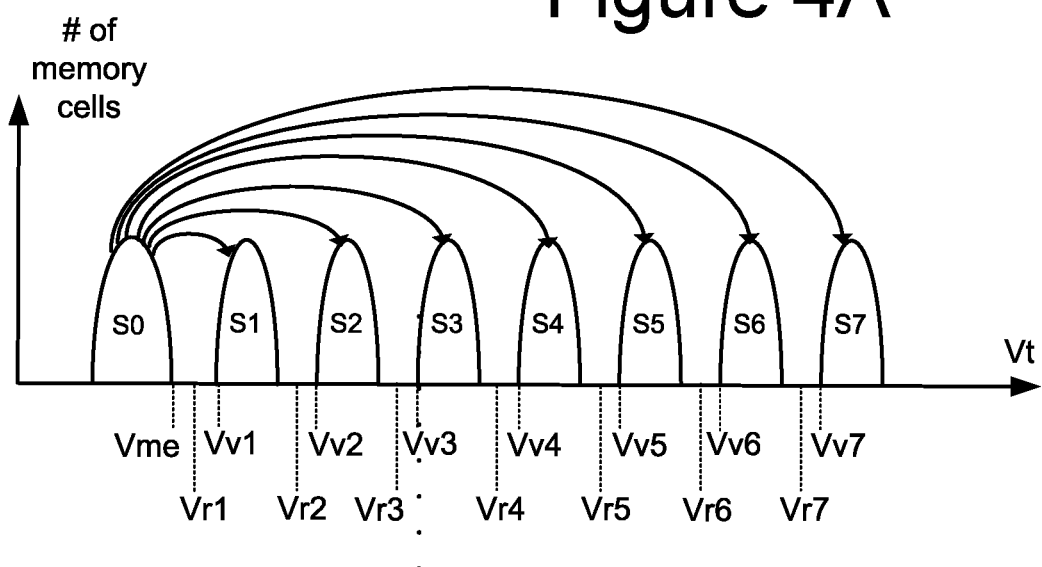
FIG. 4A is a graph of number of memory cells versus threshold voltage.

The memory systems discussed herein can be erased, programmed and read. At the end of a successful programming process (with verification), the threshold voltages of the memory cells should be within one or more distributions (ranges) of threshold voltages for programmed memory cells or within a distribution (range) of threshold voltages for erased memory cells, as appropriate. FIG. 4A illustrates example threshold voltage distributions (ranges) for MLC memory cells that store three bits of data. Other embodiments, however, may use other data capacities per memory cell (e.g., such as one, two, four, or five bits of data per memory cell). FIG. 4A shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4A also shows seven read reference voltages (also referred to as read compare voltages) Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 4A also shows seven verify reference voltages (also referred to as program verify targets) Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 4A represent the full sequence programming. The technology described herein can also be used with other types of programming in addition to full sequence programming (including, but not limited to, multiple stage/phase programming). In some embodiments, data states S1-S7 can overlap, with controller 102 relying on an ECC algorithm to identify the correct data being stored.

Figure 4B:
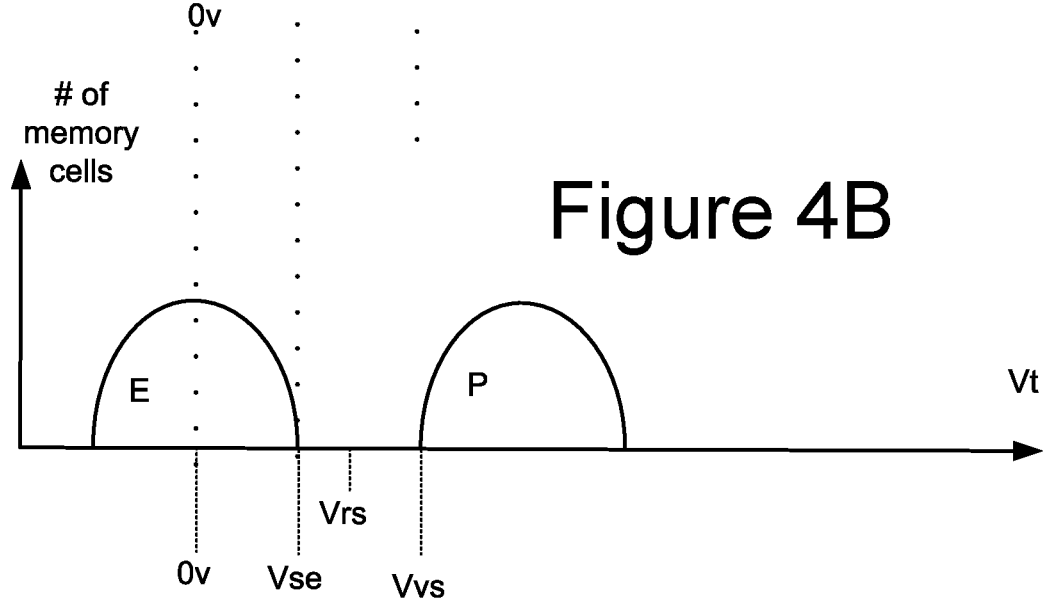
FIG. 4B is a graph of number of memory cells versus threshold voltage.

FIG. 4B illustrates example threshold voltage distributions (ranges) for SLC memory cells. As discussed above, SLC memory cells can be erased or programmed. When erased, the SLC memory cells have threshold voltages in the erased threshold voltage distribution (range) E. When programmed, the SLC memory cells have threshold voltages in the programmed threshold voltage distribution (range) P.

FIG. 4B also shows a read reference voltage (also referred to as read compare voltage) Vrs, a verify reference voltage (also referred to as program verify target) Vvs and an erase verify target Vse. When programming from E to P, the system raises the threshold voltages of the memory cells until they reach at least Vvs. When erasing from P to E, the system lowers the threshold voltages of the memory cells until they reach at least Vse. To read a memory cell storing SLC data, the systems test whether the threshold voltage of the memory cells is less than or greater than Vrs.

Example voltages for FIG. 4A are Vr1=0v, Vr2=1v, Vr3=2v, Vr4=3v, Vr5=4v, Vr6=5v, Vr7=6v, Vv1=0.4v, Vv2=1.4v, Vv3=2.4v, Vv4=3.4v, Vv5=4.4v, and Vv6=5.4v, Vv7=6.4v. Example voltages for FIG. 4B are Vse=Vr2=1v, Vvs=Vv3=2.4v and Vrs=1.2v. Thus, the threshold voltage distribution S0 for the erased data state for MLC (in this example embodiment) is completely below 0 volts (see FIG. 4A). On the other hand, the threshold voltage distribution E for the erased data state for SLC depicted in FIG. 4B (in this example embodiment) is partly below 0 volts and partly above zero volts. The lower boundary (corresponding to Vvs) of the threshold voltage distribution P of the SLC programmed data state is the same voltage as Vv3.

Figure 4C:
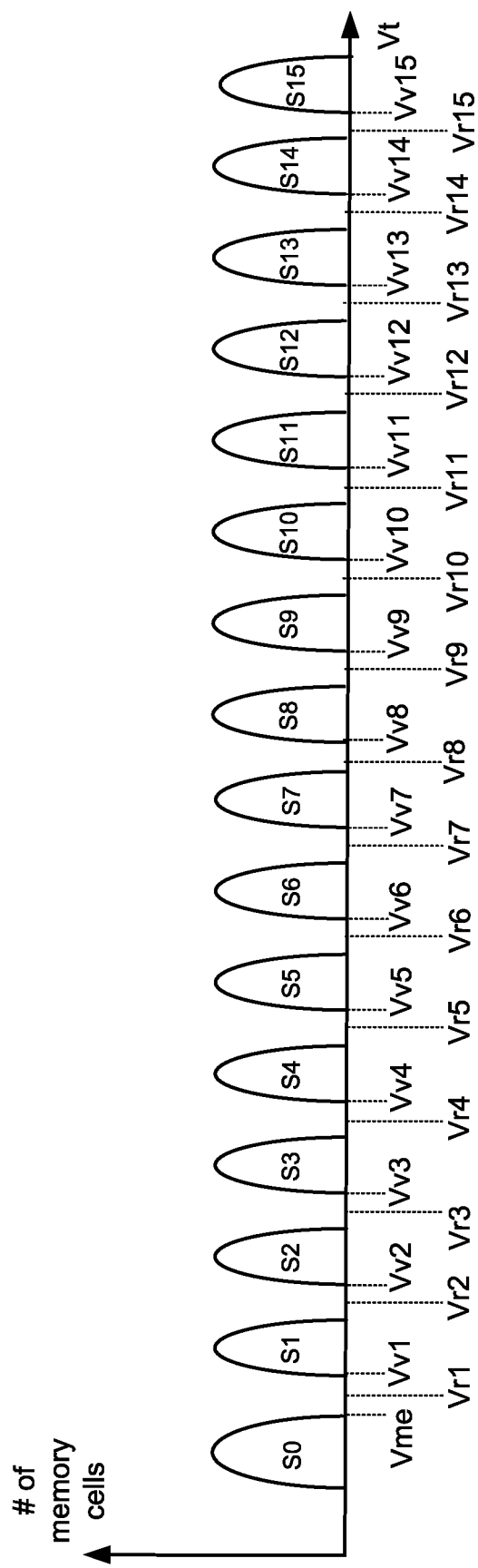
FIG. 4C illustrates example threshold voltage distributions (ranges) for MLC memory cells that store four bits of data.

FIG. 4C illustrates example threshold voltage distributions (ranges) for MLC memory cells that store four bits of data. FIG. 4C shows sixteen threshold voltage distributions, corresponding to sixteen data states. The first threshold voltage distribution (data state) S0 represents memory cells that are erased. The other fifteen threshold voltage distributions (data states) S1-S15 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4C also shows fifteen read reference voltages (also referred to as read compare voltages) Vr1, Vr2, Vr3, Vr4, Vr5, Vr6, Vr7, Vr8, Vr9, Vr10, Vr11, Vr12, Vr13, Vr14, and Vr15, for reading data from memory cells. By testing (e.g., performing sense operations) whether the threshold voltage of a given memory cell is above or below the seven read reference voltages, the system can determine what data state (i.e., S1, S2, S3, S4, . . . ) a memory cell is in. Note that the read reference voltages Vr1, Vr2, Vr3, Vr4, Vr5, Vr6, Vr7 may be different voltage levels that for the three bit per cell example of FIG. 4A.

FIG. 4C also shows fifteen verify reference voltages (also referred to as program verify targets) Vv1, Vv2, Vv3, Vv4, Vv5, Vv6, Vv7, Vv8, Vv9, Vv10, Vv11, Vv12, Vv13, Vv14, and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. Similar procedures are followed for the other programmed states.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14, S15. For example, while some memory cells are being programmed from data state S0 to data state S1, other memory cells are being programmed from data state S0 to data state S2 and/or from data state S0 to data state S3, and so on. The technology described herein can also be used with other types of programming in addition to full sequence programming (including, but not limited to, multiple stage/ phase programming). In some embodiments, data states S1-S12 can overlap, with controller 102 relying on an ECC algorithm to identify the correct data being stored. One type of multi-phase programming that is used to program the memory cells to data states S1, S2, S3, S4, S5, S6, S7, S8, S9, S10, S11, S12, S13, S14, S15 is referred to as a coarse-fine program operation.

Figure 5:
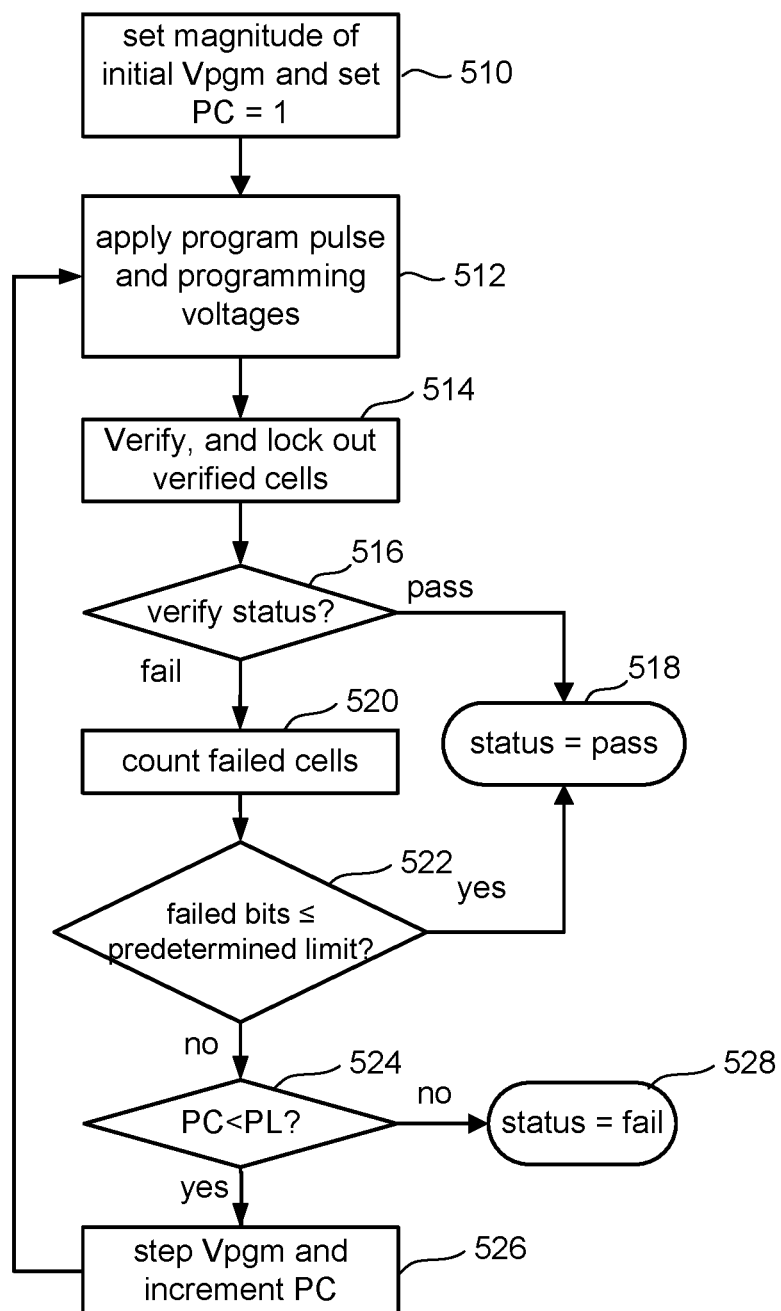
FIG. 5 is a flow chart describing one embodiment of a process for programming.

FIG. 5 is a flowchart describing one embodiment of a process for programming. The process of FIG. 5 is performed by the memory die in response instructions, data and one or more addresses from controller 102. The process of FIG. 5 can also be used to implement the full sequence programming discussed above. The process of FIG. 5 can also be used to implement each phase of a multi-phase programming process. Additionally, the process of FIG. 5 can be used to program memory cells connected to the same word line for SLC or MLC.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 510 of FIG. 5, the programming voltage (Vpgm) is initialized to the starting magnitude (e.g., ~12-16V or another suitable level) and a program counter PC maintained by the state machine is initialized at 1. In step 512, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 512, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 514, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 516, it is determined whether all the memory cells have reached their target threshold voltages (pass). If so, the programming process is complete and successful because all selected memory cells were programmed and verified to their target data states. A status of "PASS" is reported in step 518. If, in 516, it is determined that not all of the memory cells have reached their target threshold voltages (fail), then the programming process continues to step 520.

In step 520, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 522, it is determined whether the count from step 520 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 518. In this situation, enough memory cells programmed correctly such that the few remaining memory cells that have not been completely programmed can be corrected using ECC during the read process. In some embodiments, step 520 will count the number of failed cells for each page, each target data state or other unit, and those counts will individually or collectively be compared to a threshold in step 522.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 524 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 528. This is one example of a program fault. If the program counter PC is less than the program limit value PL, then the process continues at step 526 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 526, the process loops back to step 512 and another program pulse is applied to the selected word line so that another iteration (steps 512-526) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4A) or verify operation (e.g. see verify reference voltages Vv1, Vv2, Vv3, Vv4, Vv5, Vv6, and Vv7 of FIG. 4A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 102 receives a request from the host (or a client, user, etc.) to program host data (data received from the host) into the memory system. In some embodiments, controller 102 arranges the host data to be programmed into units of data. For example, controller 102 can arrange the host data into pages, partial pages (a subset of a page), word line units, blocks, jumbo blocks, or other units.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC are better suited for flash memory than others. Generally, ECC for flash storage devices tend to have higher code rates (i.e., a lower ratio of code bits to data bits) than the codes used in data communications applications (which may have code rates as low as ½). Examples of well-known ECC commonly used in connection with flash memory include Reed-Solomon codes, other BCH codes, Hamming codes, and the like. Sometimes, the error correction codes used in connection with flash memory are "systematic," in that the data portion of the eventual codeword is unchanged from the actual data being encoded, with the code or parity bits appended to the data bits to form the complete codeword.

The particular parameters for a given error correction code include the type of code, the size of the block of actual data from which the codeword is derived, and the overall length of the codeword after encoding. For example, a typical BCH code applied to a page of 512 bytes (4096 bits) of data can correct up to four error bits, if at least 60 ECC bits are used. Reed-Solomon codes are a subset of BCH codes, and are also commonly used for error correction. For example, a typical Reed-Solomon code can correct up to four errors in a 512 byte page of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the storage device), also referred to as information bits, that is to be stored non-volatile memory structure 326. The informational bits are represented by the matrix i=[1 0] (note that two bits are used for example purposes only, and many embodiments have codewords longer than two bits). An error correction coding process (such as any of the processes mentioned above or below) is implemented by ECC engines 226/256 of controller 102 in which parity bits are added to the informational bits to provide data represented by the matrix or codeword v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engines 226/256) to multiple pages encoded across a number of memory elements, but they do not need to be applied across multiple pages. The data bits can be mapped to a logical page and stored in memory structure 326 by programming one or more memory cells to one or more programming states, which corresponds to v.

In one possible implementation, an iterative probabilistic decoding process is used (e.g., by ECC engines 226/256) when reading data which implements error correction decoding corresponding to the encoding implemented in the controller 102. Further details regarding iterative probabilistic decoding can be found in the above-mentioned D. MacKay text. The iterative probabilistic decoding attempts to decode a codeword read from the memory by assigning initial probability metrics to each bit in the codeword. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the memory elements are known.

The LLR for a bit is given by:

$$Q = \log_2 \frac{P(v=0 \mid Y)}{P(v=1 \mid Y)}$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a codeword. Further, the LLR tables can account for the multiple read results so that an LLR of greater magnitude is used when the bit value is consistent in the different codewords.

When reading data, controller 102 (e.g., by ECC engines 226/256) receives the codeword Y1 and accesses the LLRs and iterates in successive iterations in which it determines if parity checks of the error encoding process have been satisfied. If all parity checks have been satisfied, the decoding process has converged and the codeword has been successfully error corrected (decoded). If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the codeword, if applicable, once the parity check in question has been satisfied. In others, the process moves to the next parity check, looping back to the failed check at a later time. The process continues in an attempt to satisfy all parity checks. Thus, in one embodiment, the decoding process of Y1 is completed to obtain the decoded information including parity bits v and the decoded information bits i. As part of the decoding process, controller tracks how many bits needed to be flipped, which is an indication of the number of errors in the information sensed from the memory cells. This indication of error is also referred to as bit error rate (BER).

It is possible for the decoding process to fail to successfully decode the codeword, which is referred to herein as an uncorrectable ECC failure (or UECC). In one embodiment, in the event that the codeword is uncorrectable by ECC, redundancy data is used to recover the codeword. The redundancy data for a group of pages may be generated by XOR engine 224/254. In one embodiment, the redundancy data for the group of pages is stored in non-volatile memory cells in the memory structure 326.

FIG. 6A depicts the first pass of the multi-pass programming process, which includes programming the memory cells from the erased state (S0) to any of the programmed data states S1-S7, similar to full sequence programming. However, rather than using the standard verify reference voltages (e.g., Vv1, Vv2, Vv3, Vv4, Vv5, Vv6, and Vv7), the process of FIG. 6A uses an alternate set of verify reference voltages (e.g., Vv1', Vv2', Vv3', Vv4,' Vv5', Vv6', and Vv7') that are each slightly lower than the corresponding standard verify reference voltage. Thus, the threshold voltages of FIG. 6A can be thought of as intermediate threshold voltage distributions (or intermediate data states) that are at lower voltages than the threshold voltages of FIG. 4A. Note that memory cells in the erased state S0 that are to be in data state S0, are inhibited from programming.

FIG. 6B depicts the second (and last) pass of the multi-pass programming process, which includes programming the memory cells to tighten the threshold distributions. Thus, the memory cells are programmed from the intermediate threshold voltage distributions (or intermediate data states) of FIG. 6A to the final or target threshold voltage distributions (or data states) of FIG. 6B using the standard verify reference voltages (e.g., Vv1, Vv2, Vv3, Vv4, Vv5, Vv6, and Vv7). FIG. 6A is referred to as the Coarse pass and FIG. 6B as the Fine Pass. The Coarse pass could also be referred to as a rough pass or as a foggy pass. The Fine pass could also be referred to as a high-accuracy pass. In one embodiment, the Coarse pass of FIG. 6A is performed for a given word line, followed by the Coarse pass for the next word line. The Coarse pass for the next word line could give rise to interference for the given word line, thereby widening the intermediate threshold voltage distributions, which could lead to errors when reading the data. However, the Fine pass of FIG. 6B is subsequently performed after Coarse pass for the next word line, removing or reducing the effects of interference from the next word line. Note that memory cells in the erased state E that are to be in data state S0, are inhibited from programming.

In one embodiment, the coarse-fine program scheme is implemented in a Bit-Cost-Scalable (BiCs) architecture. FIGS. 6A and 6B depict an example in which memory cells are programmed to three bits per memory cell. In one embodiment, memory cells are programmed to four bits per memory cell (referred to herein as "QLC", quad level cell). A coarse-fine program scheme can compensate for Neighbor Word line Interference ("NWI") effect significantly by reducing the threshold voltage (Vt) difference between coarse and fine.

A coarse-fine program scheme may be used for to program memory cells that store two-, three-, four-, five-, or more than five-bits per cell. In one embodiment, a coarse-fine program scheme is used to program memory cells to four-bits per cell by modifying the process of FIGS. 6A and 6B to account for additional states S8-S15. In this case, the example of FIG. 6A can be modified to add verify levels Vv8'-Vv15' for additional programmed states S8-S15. However, the coarse program phase is not required to have a verify level associated with each programmed state S1-S15. In some embodiments, predictive programming is used to reduce the number of verifies during a programming operation. FIGS. 7A and 7B depict one embodiment of multi-pass programming in which predictive programming is used to reduce the number of verifies during a programming operation. FIGS. 7A and 7B depict one embodiment that can be used during a coarse program phase. The Vt distributions of states S0-S15 in FIG. 7B represent one embodiment after a coarse programming phase. The coarse programming phase is followed by a fine programming phase in some embodiments (similar to the fine programming phase depicted in FIG. 6B). Note that FIGS. 7A and 7B depict programming that occurs during the same programming phase.

FIG. 7A shows that memory cells are programmed from S0 to a threshold voltage reference level at a lower tail of one of four checkpoint states (CPA, CPB, CPC, CPD). After a programming pulse the memory cells are checked to determine their Vt relative to their target state and/or the checkpoint states. In one embodiment, until the memory cell's Vt reaches its checkpoint state, it receives "full programming" on the next program loop by way of the voltage of the program enable voltage applied to the bit line of the memory cell. For example, a full program enable voltage (e.g., VSS or 0V) is applied to the bit line associated with the memory cell (and a program voltage is applied to the memory cell's control gate).

An example will be discussed in which the memory cells are programmed to one of sixteen states (S0-S15). For example, memory cells to be programmed to any of states S1, S2, or S3 receive a program pulse followed by a program verify until the memory cell reaches reference level Vc1A, which is at the lower tail of checkpoint state CPA 702. Memory cells to be programmed to any of states S4, S5, S6, or S7 receive a program pulse followed by a program verify until the memory cell reaches reference level Vc1B, which is at the lower tail of checkpoint state CPB 704. Memory cells to be programmed to any of states S8, S9, S10, or S11 receive a program pulse followed by a program verify until the memory cell reaches reference level Vc1C, which is at the lower tail of checkpoint state CPC 706. Memory cells to be programmed to any of states S12, S13, S14, or S15 receive a program pulse followed by a program verify until the memory cell reaches reference level Vc11D, which is at the lower tail of checkpoint state CPD 708. Those of skill in the art recognize that programming from state 0, S0, the erased state can be done by applying a single pulse to the cells to change their Vt to the checkpoint state CPA, CPB, CPC, CPD and a single program verify, or a series of program pulses with associated program verify operations can be applied to the cells until they reach a checkpoint state CPA, CPB, CPC, CPD.

FIG. 7B depicts programming of the memory cells from the checkpoint states 702, 704, 706, 708 to their respective target states. For example, some memory cells are programmed from checkpoint state CPA 702 to one of states S1, S2, or S3. Some memory cells are programmed from checkpoint state CPB 704 to one of states S4, S5, S6, or S7. Some memory cells are programmed from checkpoint state CPC 706 to one of states S8, S9, S10, or S11. Some memory cells are programmed from checkpoint state CPD 708 to one of states S12, S13, S14, or S15.

It should be noted that some memory cells targeted to states that overlap the checkpoint states CPA, CPB, CPC, CPD, may be within the desired target state such that those cells receive no more programming. Examples could be memory cells targeted for states S1, S4, S8, and S12. Memory cells to be programmed to any of states S2, S3, S5, S6, S7, S9, S10, S11, S13, S14, or S15 receive one or more additional program pulses after reaching their respective checkpoint states. However, in one embodiment, program verify operations are not performed for these states after the checkpoint state has been reached. Applying one or more program voltages without performing a program verify operation to determine whether the memory cell has reached its target state is referred to herein as "predictive programming." Hence, a reduced number of verify operations is performed. A non-checkpoint state ("non-CP state") is a target state that does not overlap with a checkpoint state. A non-checkpoint state is also a state that is a target state for memory cells predictively programmed from a checkpoint state to the target state. Hence, states S2 and S3 are non-checkpoint states associated with checkpoint state CPA 702; S5, S6, and S7 are non-checkpoint states associated with checkpoint state CPB 704; S9, S10, and S11 are non-checkpoint states associated with checkpoint state CPC 706; and S13, S14, and S15 are non-checkpoint states associated with checkpoint state CPD 708. In FIG. 7B, states S1, S4, S8, and S12 are not considered to be non-CP states because the memory cells are not predictively programmed to states S1, S4, S8, and S12 and these states overlap checkpoint states. In FIG. 7B, states S1, S4, S8, and S12 are referred to as CP states. In certain embodiments, certain memory cells with a Vt greater than a verify low threshold for a checkpoint state may still receive one more program pulses so that the Vt moves to within the pre-defined target state, S1, S4, S8, or S12. Moreover, each of CP states S1, S4, S8, and S12 is associated with one of CP states 702, 704, 706, 708 by way of the verify low and associated verify high voltage. Note that for each verify low voltage the next highest verify voltage in FIG. 7B is an associated verify high voltage.

FIG. 7B depicts a second set of verify levels (VchA, VchB, VchC, VchD), which are referred to herein as verify high (VH) reference levels. Each of these verify high reference levels is associated with one of the verify low (VL) reference levels. The lower tail of some of the states is at one of the verify high reference levels, in this example. For example, the lower tail of state S1 is at VchA, the lower tail of state S4 is at VchB, the lower tail of state S8 is at VchC, and the lower tail of state S12 is at VchD. In one embodiment, memory cells to be programmed to one of states S1, S4, S8 or S12 are programmed using quick pass write (QPW) after reaching their respective verify low reference levels.

The idea of QPW is to slow down cell programming when the cell is close to its target state. A verify low (e.g., VclA) and a verify high (VchA) verify reference level is used to determine what voltage to apply to the bit line. If the memory cell's Vt is below the verify low reference level, the memory cell receives "full programming" on the next program loop. Full programming is achieved by applying a program voltage to the memory cell's control gate (e.g., apply program voltage to word line) while applying a full program enable voltage to the bit line associated with the memory cell. In one embodiment, the full program enable voltage is VSS (about 0 V).

If the memory cell's Vt is between the verify low reference level and the verify high program level, the memory cell receives "weak programming" on the next program loop. Weak programming is achieved by applying a program voltage to the memory cell's control gate (e.g., apply program voltage to selected word line) while applying a weak program enable voltage to the bit line associated with the memory cell. The weak program enable voltage may also be referred to as a quick pass write (QPW) voltage. The QPW voltage allows the memory cell to program, but the memory cell will program more weakly than with the full programming of the full program enable voltage (assuming the same program voltage is applied to the memory cell's control gate). Thus, the QPW voltage provides a way to slow the programming of the memory cell.

When performing QPW, if the memory cell's Vt is above the verify high reference level, the memory cell is inhibited from programming on the next program loop. This may be referred to as locking out the memory cell from further programming. Program inhibit is achieved by applying the program inhibit voltage to the bit line associated with the memory cell to prevent the program voltage from programming the memory cell. Note the boosting voltages (e.g., Vpass) may also be applied to unselected word lines to boost the NAND channel potential. In one embodiment, the program inhibit voltage cuts off the NAND channel from the bit line to allow the boosting voltages to raise the NAND channel potential. In one embodiment, the program inhibit voltage is VDD (about 2 V). In one embodiment, the QPW voltage is larger than the full program enable voltage, but smaller than the program inhibit voltage.

For example, memory cells to be programmed to state S1 continue to receive additional programming until their Vt reaches VchA. However, after such memory cells reach VclA, the voltage on the bit line is changed from a full program enable voltage (e.g., 0V) to what is referred to herein as a weak program enable voltage (e.g., 0.5V). Moreover, a verify operation may be performed at the verify high reference level. Hence, in one embodiment, these memory cells are not referred to as a non-checkpoint state.

Figure 8:
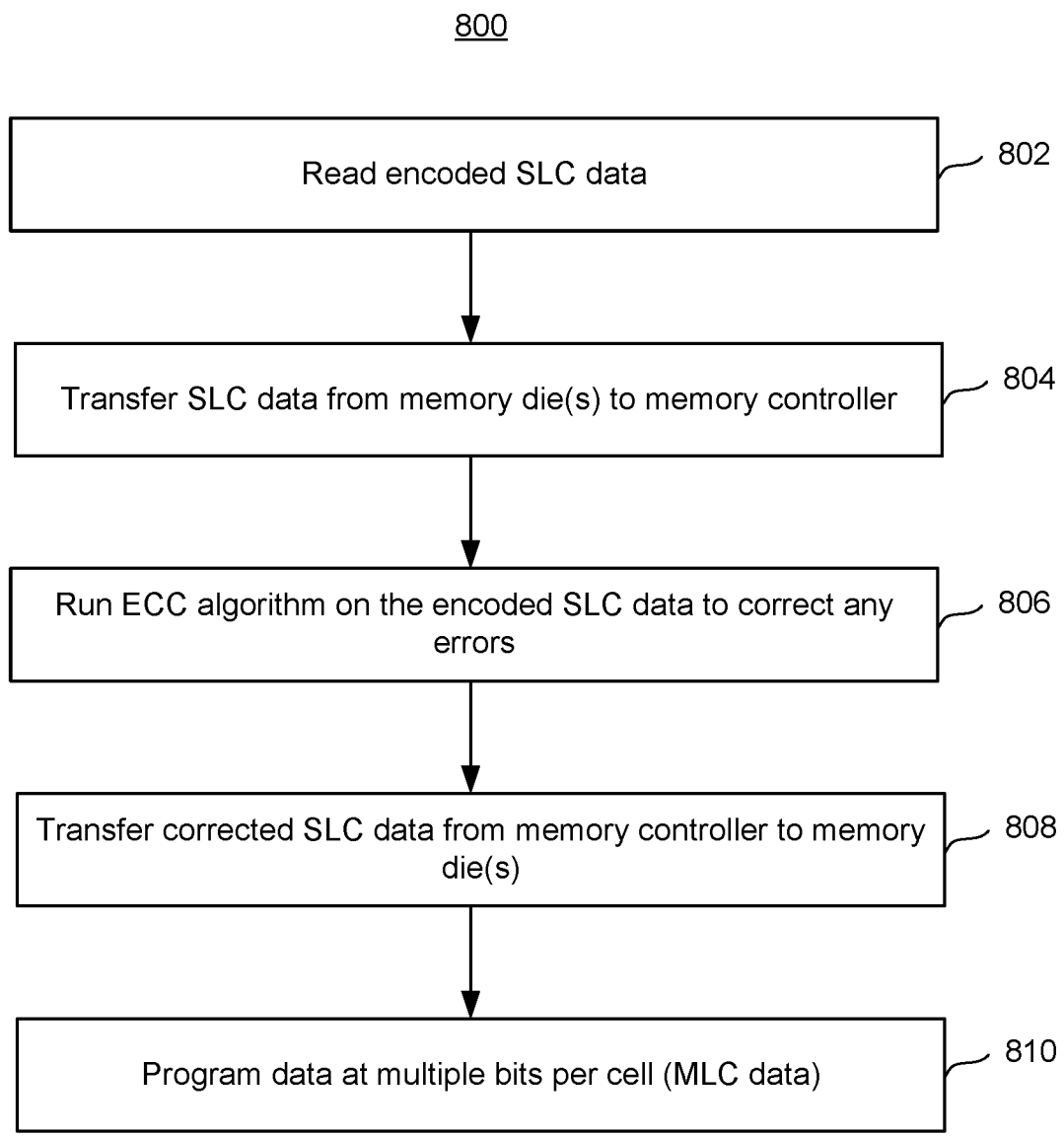
FIG. 8 is a flowchart describing one embodiment of a process of folding SLC data to MLC data.

FIG. 8 is a flowchart of one embodiment of a process 800 of folding SLC data to MLC data. The MLC data may be two-bits, three-bits, four-bits, five-bits, or a greater number of bits per memory cell. The non-volatile memory cells that store the SLC data may be on the same memory die 300 or a different memory die than the non-volatile memory cells that store the MLC data.

Step 802 includes reading encoded SLC data. Herein, SLC data refers to data stored at one bit per memory cell. Step 802 may include reading a number of pages of encoded SLC data. In one embodiment, each unit of SLC data includes a codeword formed from user data. In one embodiment, the error correction codes used in connection with SLC data are "systematic," in that the data portion of the eventual codeword is unchanged from the actual SLC data being encoded, with the ECC bits appended to the data bits to form the complete codeword. However, other techniques can be used that map input data to the eventual codeword in more complex manners. In one embodiment, low density parity check (LDPC) codes are used to form the codeword for the SLC data.

Step 804 includes transferring SLC data from one or more memory die 300 to the memory controller 102.

Step 806 includes running an ECC algorithm on the encoded SLC data. In one embodiment, one of the ECC engines 226/256 is used to perform error correction on the SLC data. In one embodiment, the ECC engines 226/256 produce a corrected version of the SLC data, based on the codeword that was read from the SLC memory cells. For the sake discusses process 800, it will be assumed that the ECC algorithm is able to correct any errors in the SLC data. Herein, techniques are discussed for recovering the SLC data in the event that the ECC algorithm (e.g., ECC engines 226/256) are not able to decode, correct, or recover the SLC data.

Step 808 includes transferring the corrected SLC data from the memory controller 102 to one or more memory dies 300.

Step 810 includes programming the data that was received in step 808 at multiple bits per cell. In one embodiment, the data is programmed using a multi-phase program operation. In one embodiment, a coarse-fine program operation is used.

Figure 9:
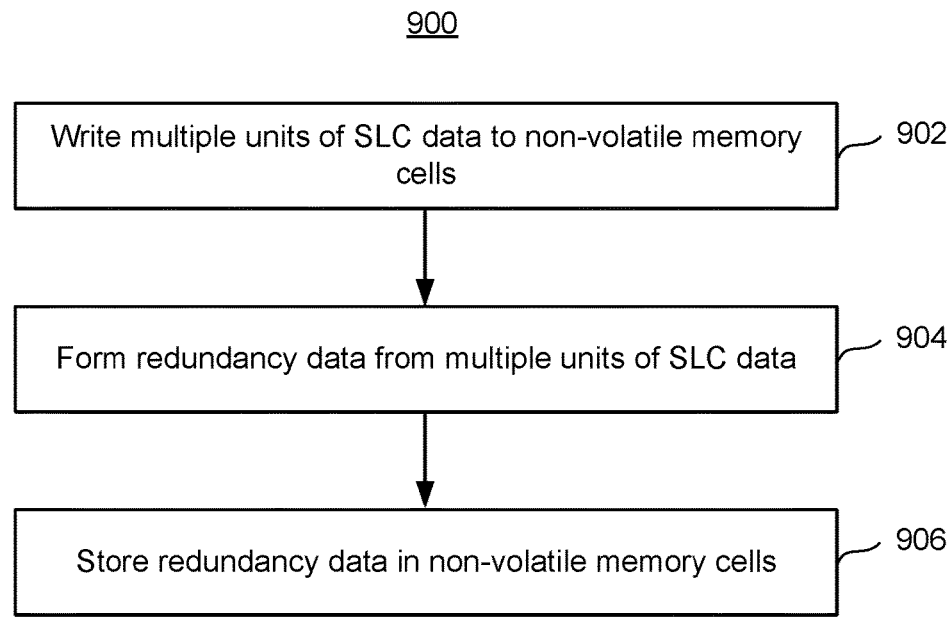
FIG. 9 is a flowchart describing one embodiment of a process of storing redundancy data, which may be used to recover UECC SLC data.
Figure 10:
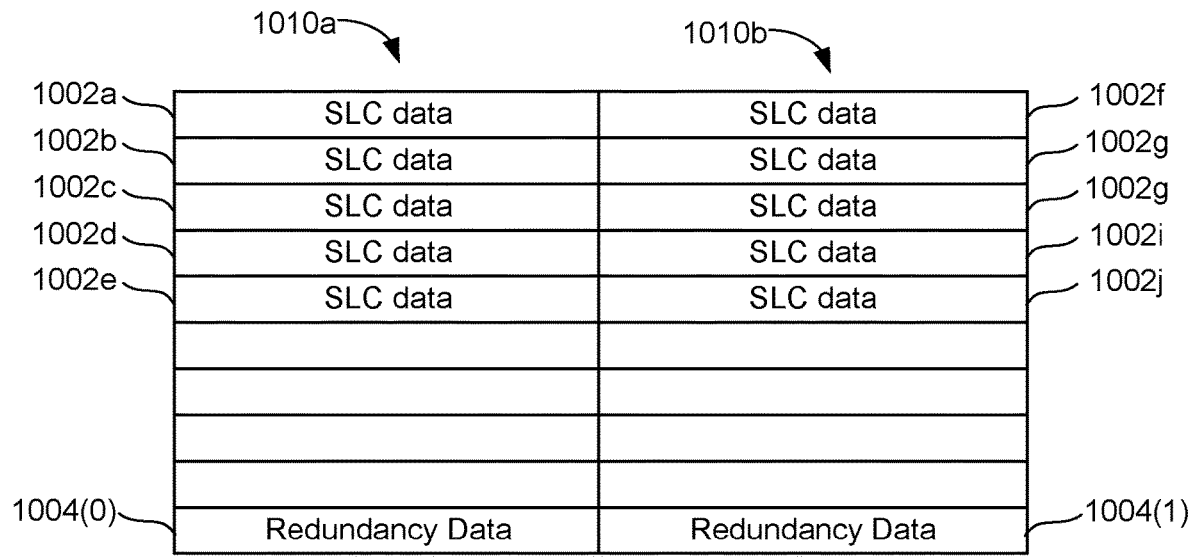
FIG. 10 depicts one embodiment of two blocks of memory cells that store SLC data.

In some embodiments, UECC SLC data is recovered using redundancy data. FIG. 9 is a flowchart of one embodiment of a process 900 of storing redundancy data, which may be used to recover UECC SLC data. FIG. 10 will be referred to when discussing the process 900. FIG. 10 depicts one embodiment of two blocks 1010a, 1010b of memory cells that store SLC data. In one embodiment, the two blocks are on different planes of a memory die 300.

Step 902 includes writing multiple units of SLC data to non-volatile memory cells. For ease of discussion, an example will be discussed of write multiple pages of SLC data. In one embodiment, each page is written to one word line in a block of non-volatile memory cells. This block will be used to store only SLC data, and hence will be referred to as an SLC block. With reference to FIG. 10, the SLC data 1002a represents one page of SLC data. Likewise, SLC data 1002b-1002j each represent one page of SLC data. In this example, SLC data 1002a-1002e are written to plane 0 on a memory die, and SLC data 1002f-1002j are written to plane 1 on the memory die 300.

Step 904 includes forming redundancy data from multiple units of SLC data. In one embodiment, the redundancy data is formed from a bitwise combination of each page. In one embodiment, a bitwise logical XOR is performed on each page with either another page or an intermediate result. For example, each bit of a page of SLC data 1002a is XORed with each corresponding bit of a page of SLC data 1002b to form a first intermediate result. Then, each bit the first intermediate result is XORed with each corresponding bit of a page of SLC data 1002c to form a second intermediate result. This process may be repeated with pages of SLC data 1002c, 1002d, and 1002e to form redundancy data for the SLC data in Plane 0. A similar XOR process may be performed on pages of SLC data 1002f, 1002g, 1002h, 1002i, 1002j to form redundancy data for the SLC data in Plane 1. In one embodiment, XOR engines 224/254 in the memory controller 102 perform the logical XOR operations. The redundancy data can be referred to as "XOR data" in an embodiment in which a logical XOR is used to form the redundancy data. However, the bitwise combination of the SLC pages is not required to be a bitwise XOR.

Step 906 includes storing the redundancy data in non-volatile memory cells. For example, redundancy data 1004 (0) is stored in non-volatile memory cells in block 1010a. Likewise, redundancy data 1004(1) may be stored in non-volatile memory cells in block 1010b. The redundancy data for a block may be used to recover the data in any of the pages in that block. For example, if page 1002c cannot be recovered by an ECC engine 226/256, a "de-XOR" operation may be used on the redundancy data 1004(0) and pages of SLC data 1002a, 1002b, 1002d, and 1002e to recover a page of SLC data 1002c.

The example in FIGS. 9 and 10 can be extended such that the SLC pages used to form redundancy data are not required to be in the same block. For example, the redundancy data 1004(0) could be formed from a combination of one or more pages in block 1010a and one or more pages in block 1010b. Also, the SLC pages used to form redundancy data are not required to be in the same memory die 300. For example, the redundancy data 1004(0) could be formed from a combination of one or more pages in a block of a first memory die and one or more pages in block of in a second memory die. This can be extended to using blocks in more than two memory die. In some embodiments, when using memory cells in different blocks, memory cells on different numbered word lines are used in order to reduce the chances of a UECC failure to multiple pages that are used to form the redundancy data.

Figure 11:
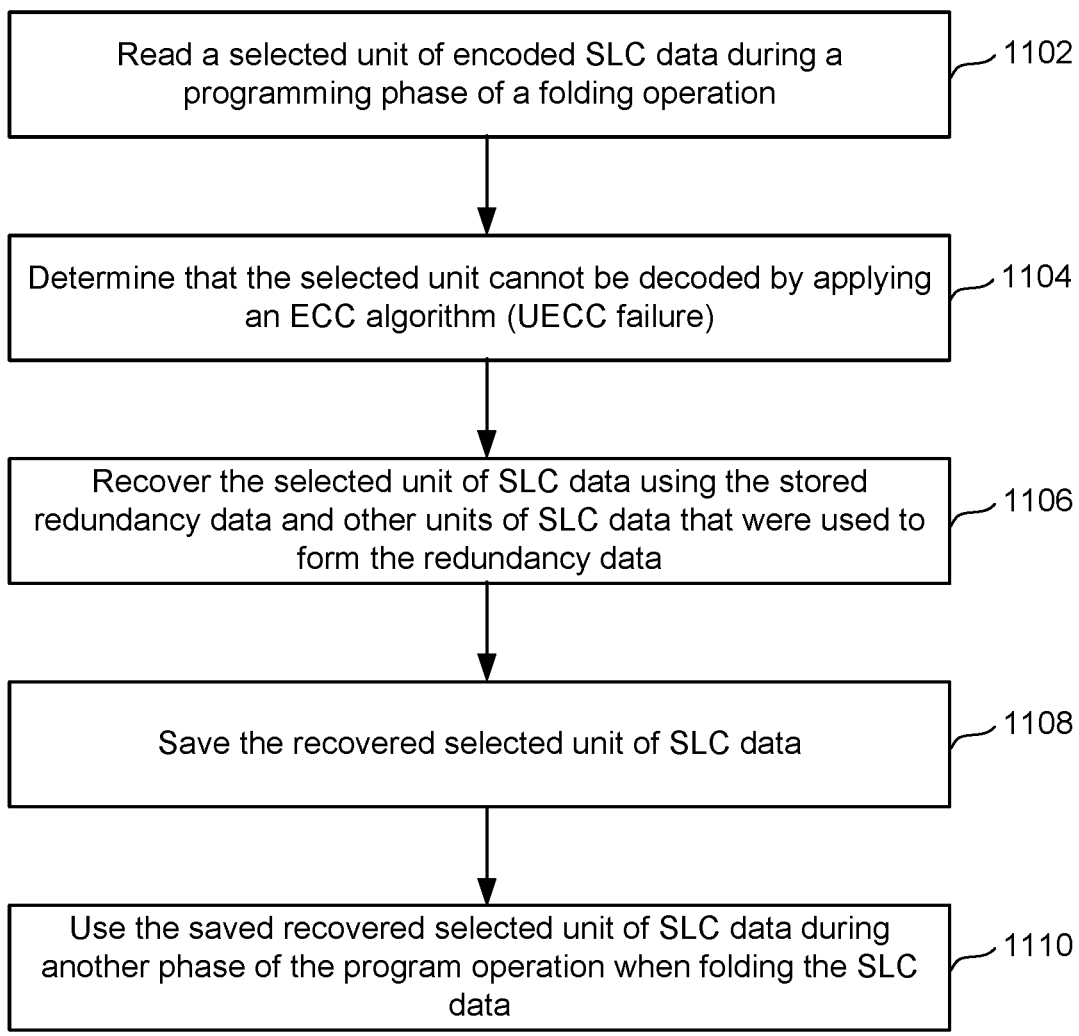
FIG. 11 is a flowchart describing one embodiment of a process of using recovered UECC SLC data when folding SLC data to MLC data.

FIG. 11 is a flowchart of one embodiment of a process 1100 of using recovered UECC SLC data when folding SLC data to MLC data. In one embodiment, the process 1100 is performed by the controller 102. In one embodiment, the process 1100 is performed by storage device 100.

Step 1102 includes reading a selected unit of encoded SLC data during a programming phase of an SLC data to MLC data folding operation. This unit is typically one of many units of encoded SLC data that are read. In one embodiment, the unit is one page of encoded SLC data. Each unit of encoded SLC data may include a codeword. In one embodiment, step 1102 occurs during a coarse programming phase of a coarse-fine program process.

Step 1104 includes determining that the selected unit of SLC data cannot be decoded, corrected, or otherwise recovered by applying an ECC algorithm, which is referred to herein as a UECC failure.

Step 1106 includes recovering the selected unit of SLC data using stored redundancy data and other units of SLC data that were used to form the redundancy data. In one embodiment, step 1106 includes performing a reverse of the process that was used to form the redundancy data.

Step 1108 includes storing the recovered unit of SLC data in memory. In one embodiment, the recovered unit of SLC data is stored in volatile memory. In one embodiment, the recovered unit of SLC data is stored in volatile memory in the memory controller 102. In one embodiment, the recovered unit of SLC data is stored in non-volatile memory. In one embodiment, the recovered unit of SLC data is stored in non-volatile memory cells on a memory die 300. Step 1108 may also include saving the address of where the recovered unit of SLC data was stored. In one embodiment, this address is saved in the memory controller 102. In one embodiment, the address is saved in SRAM 230/260.

Step 1110 includes using the stored recovered unit of SLC data during another phase of the program operation of folding the SLC data to MLC data. In one embodiment, the stored recovered unit of SLC data is used during a fine programing phase of folding the SLC data to MLC data. Step 1110 may include accessing the address of where the recovered unit of SLC data was stored (which was saved in step 1108).

The stored recovered unit of SLC data may be preserved and used again in the event that there is a program failure when performing the SLC to MLC programming operation. If there is a program failure when programming MLC data during the folding operation, then the MLC data may be programmed to a different location, such as a different block of memory cells. The stored recovered unit of SLC data may be used again during this effort to program the MLC data in another location.

Figure 12A:
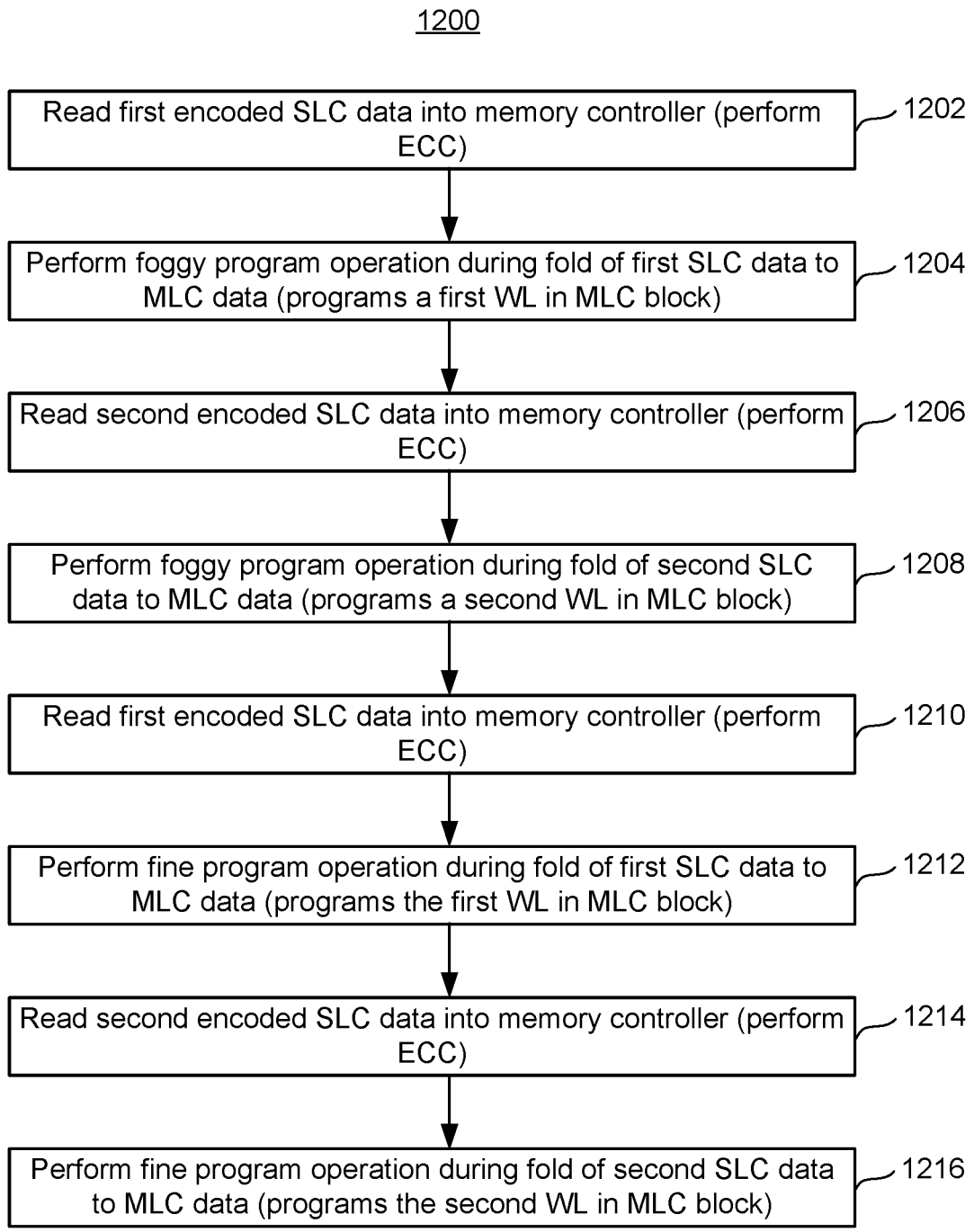
FIG. 12A is a flowchart describing one embodiment of a process of folding SLC data to MLC data.
Figure 12B:
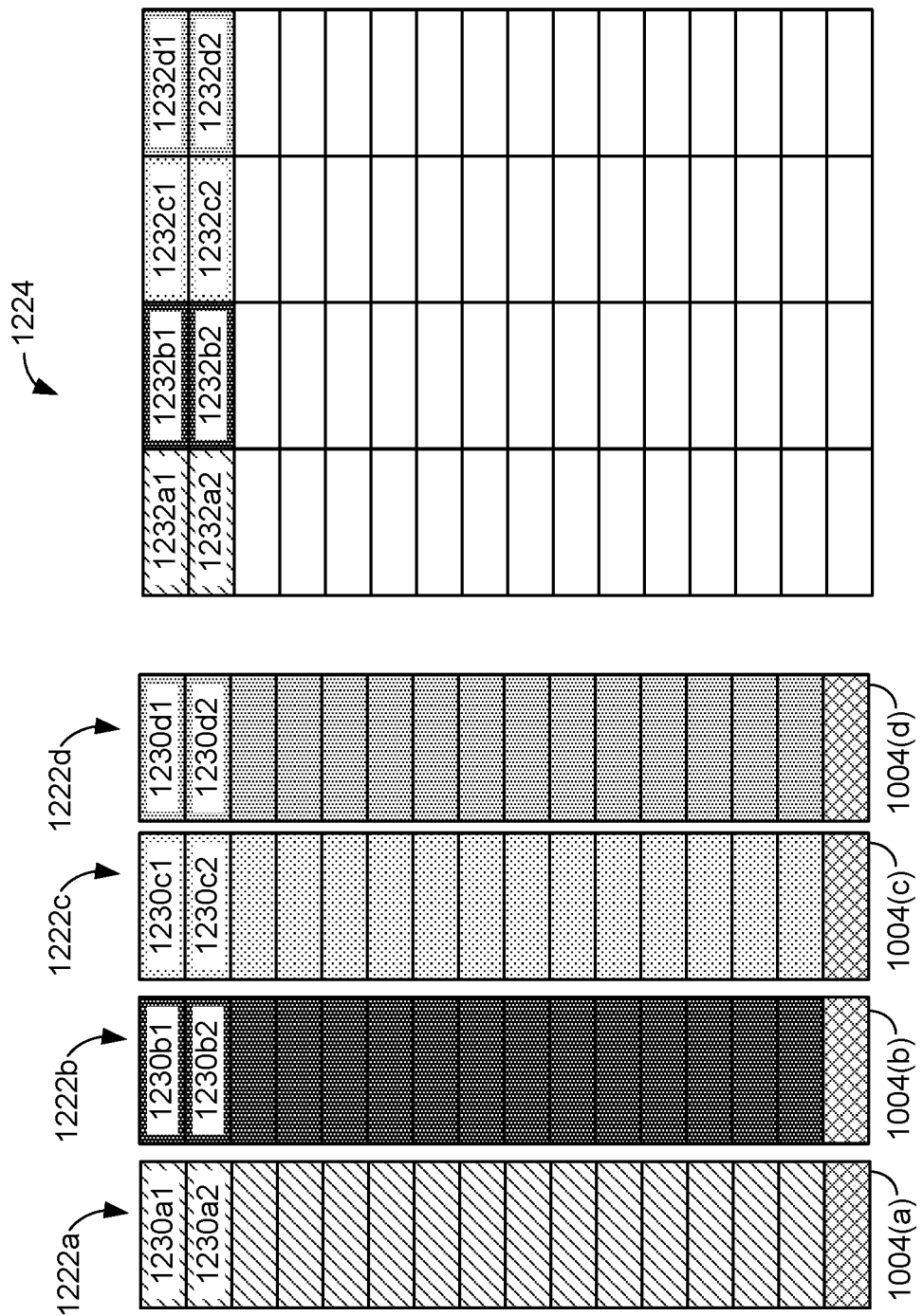
FIG. 12B depicts one embodiment of SLC blocks and one MLC block.

FIG. 12A is a flowchart of one embodiment of a process 1200 of folding SLC data to MLC data. The process 1200 uses a coarse-fine program operation. The process 1200 performs the coarse phase on memory cells on a first word line, then performs the coarse phase on memory cells on a second word line before returning to perform the fine phase on the first word line. The process 1200 will be discussed with reference to FIG. 12B. FIG. 12B depicts four SLC blocks 1222*a*, 1222*b*, 1222*c*, and 1222*d* of non-volatile memory cells that stored SLC data, as well as one MLC block 1224 of non-volatile memory cells that stores MLC data. In this example, four bits are stored per memory cell in the MLC block 1224. In one embodiment, the four SLC blocks 1222*a*, 1222*b*, 1222*c*, and 1222*d* are each on a different memory die 300. In one embodiment, the four SLC blocks 1222*a*, 1222*b*, 1222*c*, and 1222*d* are the same memory die 300. The MLC block 1224 may be on the same memory die 300 as one or more of the SLC blocks 1222*b*, or may be on a different memory die 300 than all of the SLC blocks 1222*a*-1222*d*. Note that herein, the reference numeral 1222 may be used to refer to an SLC block in general, without reference to a specific SLC block.

Step 1202 of process 1200 includes reading first encoded SLC data from non-volatile memory cells on one or more memory die 300 into the memory controller 102. For the sake of example, SLC data 1230*a*1, 1230*b*1, 1230*c*1, and 1230*d*1 is read from SLC blocks 1222*a*, 1222*b*, 1222*c*, and 1222*d*, respectively. In one embodiment, SLC data 1230*a*1, 1230*b*1, 1230*c*1, and 1230*d*1 each comprise one page of encoded SLC data. The memory controller 102 runs an ECC algorithm on the first SLC data.

In one embodiment, in the event that the memory controller 102 is not able to recover any of the first SLC data, the first SLC data is recovered using redundancy data. Each SLC block 1222 has redundancy data 1004 that may be used. The redundancy data 1004 in a given block may be formed from SLC data in that block, or more one or more different blocks. For example, redundancy data 1004(*a*) may be formed from SLC data in SLC block 1222*a*, 1222*b*, 1222*c*, and/or 1222*d*. Redundancy data 1004(*a*) may be formed from SLC data in other blocks not depicted in FIG. 12B. Furthermore, the recovered first SLC data is stored in memory in an embodiment.

Step 1204 includes performing a coarse phase of a coarse-fine program operation to fold the first SLC data to first MLC data. In one embodiment, the first MLC data is programmed into a first word line in an MLC block. The MLC block has data latches that may be used to store the first MLC data during the coarse-fine program operation. For the sake of example, MLC data 1232*a*1, 1232*b*1, 1232*c*1, and 1232*d*1 is are programmed into MLC block 1224 during the coarse-fine program operation. In this example, MLC data 1232*a*1 corresponds to SLC data 1230*a*1, MLC data 1232*b*1 corresponds to SLC data 1230*b*1, MLC data 1232*c*1 corresponds to SLC data 1230*c*1, and MLC data 1232*d*1 corresponds to SLC data 1230*d*1. In one embodiment, MLC data 1232*a*1, 1232*b*1, 1232*c*1, and 1232*d*1 are programmed into memory cells connected to the same word line in the MLC block 1224.

Step 1206 includes reading second encoded SLC data from non-volatile memory cells on one or more memory die 300 into the memory controller 102. For the sake of example, SLC data 1230*a*2, 1230*b*2, 1230*c*2, and 1230*d*2 is read from SLC blocks 1222*a*, 1222*b*, 1222*c*, and 1222*d*, respectively. In one embodiment, SLC data 1230*a*2, 1230*b*2, 1230*c*2, and 1230*d*2 each comprise one page of encoded SLC data. The memory controller 102 performs ECC on the second encoded SLC data. In one embodiment, reading and decoding the second encoded SLC data may over-write first SLC data. In one embodiment, the memory controller 102 has volatile memory that is used to contain the encoded SLC data that is read in from the SLC blocks 1222, as well as a decoded version of the SLC data. Note that the SLC data could be quite large. Hence, the volatile memory that was used to store the first SLC data may be re-used to process the second SLC data, thereby over-writing the first SLC data.

In one embodiment, in the event that the memory controller 102 is not able to recover any of the second SLC data, the second SLC data is recovered using redundancy data 1004. Furthermore, the recovered second SLC data is stored in memory in an embodiment. Further details of storing the recovered SLC data in memory are discussed below.

Step 1208 includes performing a coarse phase of a coarse-fine program operation to fold the second SLC data to second MLC data. In one embodiment, the second MLC data is programmed into a second word line in the MLC block. For example, MLC data 1232*a*2, 1232*b*2, 1232*c*2, and 1232*d*2 are programmed into MLC block 1224 during the coarse-fine program operation. In this example, MLC data 1232*a*2 corresponds to SLC data 1230*a*2, MLC data 1232*b*2 corresponds to SLC data 1230*b*2, MLC data 1232*c*2 corresponds to SLC data 1230*c*2, and MLC data 1232*d*2 corresponds to SLC data 1230*d*2. In one embodiment, MLC data 1232*a*2, 1232*b*2, 1232*c*2, and 1232*d*2 are programmed into memory cells connected to the same word line in the MLC block 1224. Moreover, this is a different word line that stores the first MLC data 1232*a*1, 1232*b*1, 1232*c*1, and 1232*d*1.

In one embodiment, the MLC block 1224 has data latches that may be used to store MLC data during the coarse-fine program operation. In one embodiment, the second MLC data 1232*a*2, 1232*b*2, 1232*c*2, and 1232*d*2 over-writes the first MLC data 1232*a*1, 1232*b*1, 1232*c*1, and 1232*d*1 in these latches in order to perform the coarse program operation.

Step 1210 includes again reading first encoded SLC data from non-volatile memory cells on one or more memory die 300 into the memory controller 102. For example, SLC data 1230*a*1, 1230*b*1, 1230*c*1, and 1230*d*1 are read from SLC blocks 1222*a*, 1222*b*, 1222*c*, and 1222*d*, respectively. In one embodiment, the memory controller 102 again runs and ECC algorithm on the first encoded SLC data. In the event that the memory controller 102 is not able to recover any of the first encoded SLC data, the recovered UECC data that was stored in step 1204 is accessed. Accessing the stored UECC data avoids the need to re-create the UECC data using the redundancy data 1004, thereby saving considerable time.

Step 1212 includes performing a fine phase of the coarse-fine program operation to complete the folding of the first SLC data to the first MLC data. In one embodiment, the first MLC data is programmed into the first word line in the MLC block. As noted above, MLC block has data latches that may be used to store MLC data during the coarse-fine program operation. However, in one embodiment, this data in these data latches was overwritten due to programming MLC data on another word line. Hence, in one embodiment, the memory controller 102 needs to re-read the first SLC data and perform ECC on the first ECC data (see step 1210) in order to have data for the latches. However, in the event that some of the SLC data is not recoverable by ECC engine in the memory controller 102, the stored recovered UECC data may be used, which saves considerable time.

Step 1214 includes again reading second encoded SLC data from non-volatile memory cells on one or more memory die 300 into the memory controller 102. For example, SLC data 1230a2, 1230b2, 1230c2, and 1230d2 are read from SLC blocks 1222a, 1222b, 1222c, and 1222d, respectively. In one embodiment, the memory controller 102 again performs ECC on the second encoded SLC data. In the event that the memory controller 102 is not able to recover any of the second SLC data, the recovered UECC data that was stored in step 1206 is accessed. This avoids the need to use the redundancy data 1004 to restore the UECC data, thereby saving considerable time.

Step 1216 includes performing a fine phase of the coarse-fine program operation to complete the folding of the second SLC data to the second MLC data. In one embodiment, the second MLC data is programmed into the second word line in the MLC block. As noted above, MLC block has data latches that may be used to store MLC data during the coarse-fine program operation. However, in one embodiment, this data in these data latches was overwritten due to programming MLC data on another word line.

Figure 13A:
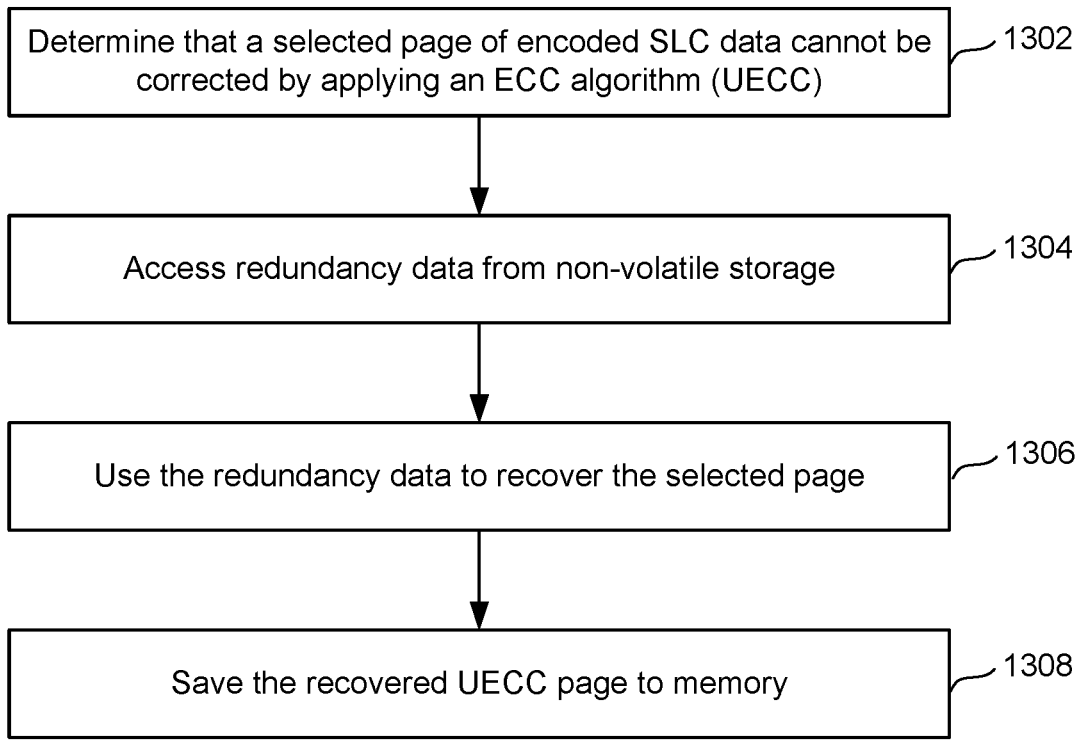
FIG. 13A provides further details of one embodiment of process of a coarse programming phase of a coarse-fine program operation.

FIG. 13A provides further details of one embodiment of process 1300 of a coarse programming phase of a coarse-fine program operation. Process 1300 may be performed during step 1202 and/or step 1206 of process 1200. For example, process 1300 may be used when processing SLC data during a coarse phase of a coarse-fine program operation used to fold SLC data to MLC data.

Step 1302 includes determining that a selected page of encoded SLC data (more briefly "SLC page") cannot be corrected, decoded, or otherwise recovered by applying an ECC algorithm. The selected SLC page might be one of units of SLC data 1230 depicted in FIG. 12B, for example. The determination may be made the controller 102. In particular, the ECC engine 226/256 may be used to attempt to decode the selected SLC page. In one embodiment, in step 1302 the controller 102 determines that the ECC engine 226/256 is unable to decode the selected SLC page. The SLC page that is not recovered by ECC engine 226/256 may be referred to as a UECC SLC page.

Step 1304 includes accessing redundancy data from non-volatile memory. For example, a page of 1004 redundancy data in one of blocks 1222 may be accessed. In one embodiment, the redundancy data is formed from the selected SLC page and one or more other SLC pages. In some embodiments, a single page of redundancy data is formed from multiple pages of SLC data. For example, a bitwise logical XOR operation may be used on the multiple pages of SLC data, as has been described herein. In one embodiment, the redundancy data is referred to as XOR data. However, the redundancy data is not limited to being formed by applying a bitwise XOR on multiple SLC pages, as another operation could be applied to the multiple SLC pages. In one embodiment, the redundancy data is formed and stored as described in steps 904 and 906 of process 900.

Step 1306 includes using the redundancy data to recover the selected SLC page. In one embodiment, the redundancy data is used to recover the selected SLC page as described in step 1106 of process 1100. The recovered page may be referred to herein as a recovered UECC selected SLC page (or more briefly as a recovered UECC page).

Step 1308 includes storing the recovered UECC page to memory. In one embodiment, the memory is volatile memory. In one embodiment, the memory is non-volatile memory. In one embodiment, the memory is non-volatile memory cells in a memory structure 326. The term "memory" expressly includes, but is not limited to, NAND, NOR, ReRAM memories, magnetoresistive memory (e.g., MRAM, Spin Transfer Torque MRAM, Spin Orbit Torque MRAM), phase change memory (e.g., PCM), and the like. The term "memory" or "computer-readable memory" shall be taken to include any tangible non-transitory memory that does not include propagated, modulated, or transitory signals.

Step 1308 may also include storing various overhead information associated with the recovered UECC page. For example, a scrambler code may be used to scramble the UECC data prior to storage in the memory structure. Saving the scrambler code ensures that the same scrambler code is used each time the UECC page is for programming MLC data. In one embodiment, this overhead information is stored with the recovered UECC page. Step 1308 may also include saving the address of where the recovered UECC page was stored. In one embodiment, this address is saved in the memory controller 102. In one embodiment, the address is saved in SRAM 230/260.

Figure 13B:
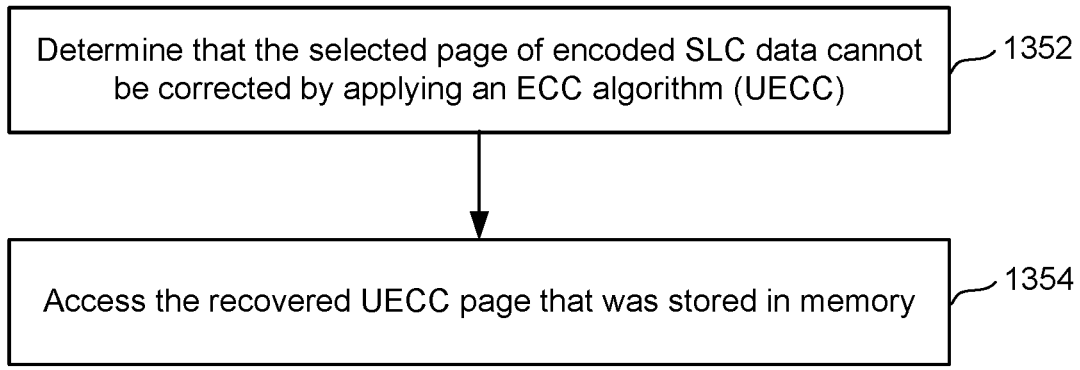
FIG. 13B provides further details of one embodiment of process of a fine programming phase of a coarse-fine program operation.

FIG. 13B provides further details of one embodiment of process 1350 of a fine programming phase of a coarse-fine program operation. In one embodiment, process 1350 is used in combination with process 1300. In other words, process 1350 may be to program the same MLC data into the same group of memory cells as process 1300. For example, process 1300 might be used to perform the coarse program phase in step 1204 of process 1200 and process 1350 might be used to perform the fine program phase in step 1212 of process 1200. As another example, process 1300 might be used to perform the coarse program phase in step 1208 of process 1200 and process 1350 might be used to perform the fine program phase in step 1216 of process 1200.

Step 1352 includes determining that the selected page of encoded SLC data cannot be decoded, corrected, or otherwise recovered by applying an ECC algorithm. This is the same SLC page as in step 1302 of process 1300. Thus, step 1352 may include a repeat of the determination of step 1302. In other words, the controller 102 may again attempt to decode the SLC page with the ECC engine 226/256.

Step 1354 includes accessing the stored recovered UECC page from memory. This is the recovered UECC page that was stored in step 1308 of process 1300. Optionally, the controller 102 may use the ECC engine 226/256 to decode the recovered UECC page. This may be performed because it is possible for one or more bits to have flipped since the UECC page was stored. Thus, the ECC engine 226/256 may be used to correct any possible bit flips in the UECC page. In one embodiment, the controller 102 does not run the ECC algorithm on the recovered UECC page. This may be possible due to an assumption that it is unlikely that there are a significant number of bit flips in the recovered UECC page. The UECC page may then be used in the folding of SLC data to MLC data.

Step 1354 may also include accessing various overhead information associated with the UECC page. For example, the scrambler code may also be accessed. In one embodiment, the address of the recovered UECC page is accessed from volatile memory in the controller 102. Recall that the address may be stored in step 1308.

FIG. 14 is a flowchart of one embodiment of a process 1400 in which the recovered UECC page is stored in volatile memory in the memory controller 102. Process 1400 provides further details for an embodiment of step 1308 of process 1300 and step 1354 of process 1350. In step 1402, the recovered UECC page is stored in volatile memory in the memory controller 102. In one embodiment, the recovered UECC page is stored in SRAM 230 or 260 (see SRAM 230/260, FIG. 1C). In one embodiment, the recovered UECC page is stored in buffer 232 or 262 (see buffer 232/262, FIG. 1C). The amount of volatile memory that is needed to store the recovered UECC page is relatively small compared to all of the SLC data associated with one embodiment of a folding operation. Step 1402 is one embodiment of step 1308.

Step 1404 includes accessing the recovered UECC page from the volatile memory in the memory controller 102. This is the recovered UECC page that was stored in step 1402. Step 1404 is one embodiment of step 1354.

FIG. 15 is a flowchart of one embodiment of a process 1500 in which the recovered UECC page is stored in volatile memory in non-volatile memory cells in the memory structure 326. Process 1500 provides further details for an embodiment of step 1308 of process 1300 and step 1354 of process 1350. In step 1502, the recovered UECC page is stored in non-volatile memory cells in the memory structure 326. In one embodiment, the recovered UECC page is stored in a safe zone 352. In one embodiment, the recovered UECC page is stored in an open SLC block. An open SLC block refers to a block in which not all of the memory cells have taken part in a programming operation. For example, at least one word line in a block has all memory cells in the erased state. However, the recovered UECC page can be written to other locations in the memory structure 326.

Step 1504 includes accessing the recovered UECC page from the non-volatile memory cells in the memory structure 326. This is the recovered UECC page that was stored in step 1502. Step 1504 is one embodiment of step 1354.

Figure 16:
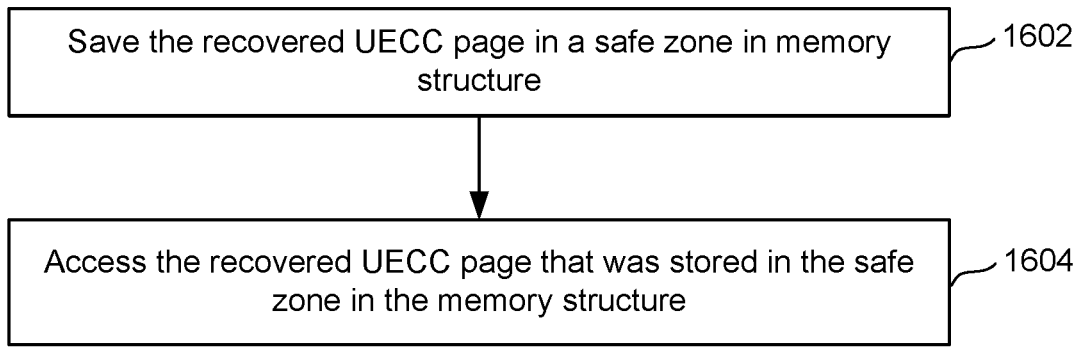
FIG. 16 is a flowchart describing one embodiment of a process in which the recovered UECC page is stored in a safe zone in the memory structure.

FIG. 16 is a flowchart of one embodiment of a process 1600 in which the recovered UECC page is stored in a safe zone 352 in the memory structure 326. Process 1600 provides further details for an embodiment of step 1308 of process 1300 and step 1354 of process 1350. In step 1602, the recovered UECC page is stored in a safe zone 352 in the memory structure 326. The safe zone 352 comprises one or more blocks of non-volatile memory cells that are reserved for storing information for managing operation of the memory structure 326. In one embodiment, the UECC page is stored in a block of non-volatile memory cells in the safe zone 352.

Step 1604 includes accessing the recovered UECC page from the safe zone in the memory structure 326. This is the recovered UECC page that was stored in step 1602. Step 1604 is one embodiment of step 1354.

Figure 17:
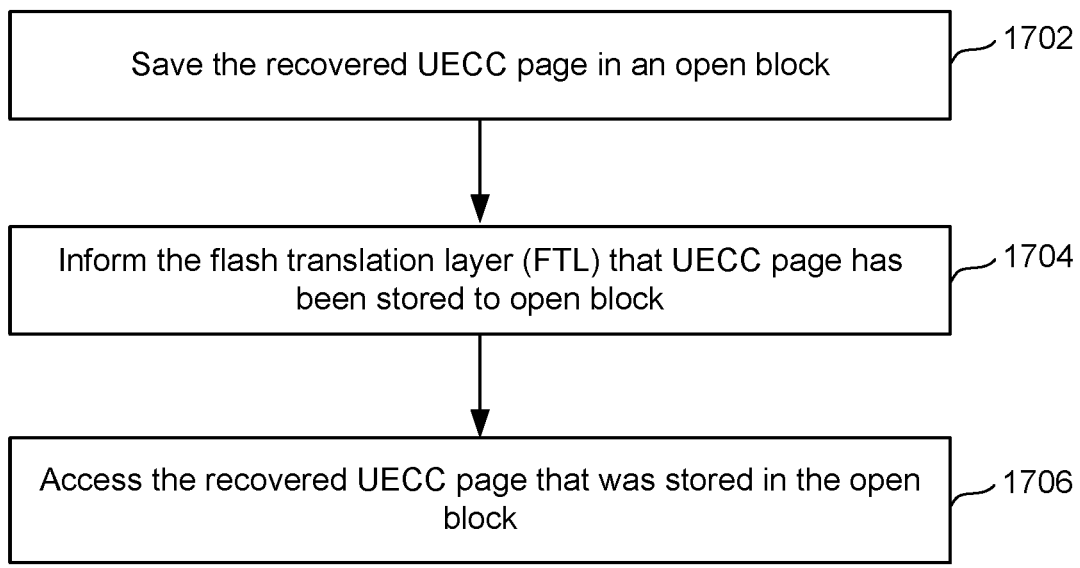
FIG. 17 is a flowchart describing one embodiment of a process in which the recovered UECC page is stored in an open block in the memory structure.

FIG. 17 is a flowchart of one embodiment of a process 1700 in which the recovered UECC page is stored in an open block in the memory structure 326. Process 1700 provides further details for an embodiment of step 1308 of process 1300 and step 1354 of process 1350. In step 1702, the recovered UECC page is stored in an open block in the memory structure 326.

Figure 18:
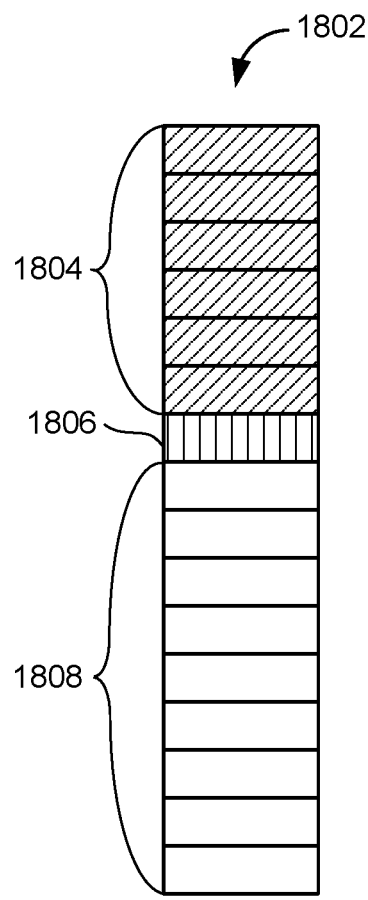
FIG. 18 depicts one embodiment of an open block of non-volatile memory cells.

FIG. 18 depicts one embodiment of an open block 1802 of non-volatile memory cells, which is one of the blocks in a memory structure 326. In one embodiment, this is an SLC block. In other words, memory cells may be programmed to a single bit per memory cell. The open block 1802 has several units 1804 of memory cells already programmed. In this example, six units of memory cells have been programmed. In one embodiment, each unit stores a page. In one embodiment, a single unit is a set of memory cells connected to the same word line. In one embodiment, each unit is connected to a different word line. The recovered UECC page 1806 is stored in the open block 1802. A portion 1808 of the open block 1802 contains memory cells that have not yet been programmed (e.g., are in the erased state).

Step 1704 includes informing the flash translation layer (FTL) that the UECC page was stored in the open block. In one embodiment, when programming data to the open block 1802 the FTL translates logical addresses to physical addresses in the memory structure 326. Informing the FTL about the UECC page allows the FTL to skip over that physical page.

Step 1706 includes accessing the recovered UECC page from the open block in the memory structure 326. This is the recovered UECC page that was stored in step 1702. Step 1706 is one embodiment of step 1354.

A first embodiment includes, an apparatus comprising a memory interface configured to be connected to non-volatile memory, and a processor circuit connected to the memory interface. The processor circuit is configured to access a selected unit of encoded single level cell (SLC) data in the non-volatile memory during a first programming phase of a process of folding data stored at a single bit per memory cell in the non-volatile memory to data stored at multiple bits per memory cell in the non-volatile memory. The processor circuit is configured to recover the selected unit of SLC data based on redundancy data formed from a plurality of units of SLC data stored at one bit per memory cell in the in the non-volatile memory. The plurality of units of SLC data include the selected unit of SLC data. The processor circuit is configured to save the recovered selected unit of SLC data to memory. The processor circuit is configured to use the saved recovered unit of SLC data during a second programming phase of folding the data stored at a single bit per memory cell in the non-volatile memory to the data stored at multiple bits per memory cell in the non-volatile memory.

In a second embodiment, and in furtherance of the first embodiment, the processor circuit comprises an error correction engine configured to determine whether the selected unit of encoded SLC data can be recovered by applying an error correcting algorithm to the encoded SLC data. The processor circuit is configured to save the recovered selected unit of SLC data to volatile memory coupled to the error correction engine.

In a third embodiment, and in furtherance of the first or second embodiments, the processor circuit is configured to save the recovered selected unit of SLC data to the non-volatile memory.

In a fourth embodiment, and in furtherance of any of the first to third embodiments, the processor circuit is configured to save the recovered selected unit of SLC data to a region of the non-volatile memory that is used as a safe zone.

In a fifth embodiment, and in furtherance of any of the first to fourth embodiments, the processor circuit is configured to save the recovered selected unit of SLC data to an open block of non-volatile memory cells in the non-volatile memory.

In a sixth embodiment, and in furtherance of any of the first to fifth embodiments, the first programming phase of the folding comprises a coarse programming phase, and the second programming phase of the folding comprises a fine programming phase.

In a seventh embodiment, and in furtherance of any of the first to sixth embodiments, the processor circuit is further configured to store the data at multiple bits per memory cell in a first word line in a block of non-volatile memory cells in the non-volatile memory during the first programming phase of the process of folding the data. In the seventh embodiment, the processor circuit is further configured to perform the second programming phase of the process of folding the data after programming data to a second word line in the block of non-volatile memory cells in the non-volatile memory.

An embodiment includes a method of operating non-volatile storage. The method comprises reading a codeword for a selected single level cell (SLC) page of data. The reading is during a coarse programming phase of folding SLC data stored at a single bit per non-volatile memory cell to multi-level cell (MLC) data stored at multiple bits per non-volatile memory cell. The method comprises applying an error correcting algorithm to the codeword for the selected SLC page. The method comprises determining that the selected SLC page is not recovered by applying the error correcting algorithm to the codeword for the selected SLC page. The method comprises recovering the selected SLC page using a redundancy page and a plurality of SLC pages other than the selected SLC page. The redundancy page comprising bitwise combinations of the selected SLC page and the plurality of SLC pages other than the selected SLC page. The method comprises saving the recovered selected SLC page to memory. The method comprises using the saved recovered selected SLC page during a fine programming phase of folding the data.

An embodiment includes non-volatile storage device comprising non-volatile memory cells, and a control circuit. The control circuit is configured to read a codeword for a selected single level cell (SLC) page in the non-volatile memory cells during a coarse programming phase of a process of folding SLC data stored at a single bit per memory cell to multi-level cell (MLC) data stored at multiple bits per memory cell. The control circuit is configured to recover the selected SLC page using a page of XOR data formed from a plurality of SLC pages stored in the non-volatile memory cells, the plurality of SLC pages include the selected SLC page. The control circuit is configured to save the recovered selected SLC page to the non-volatile memory cells. The control circuit is configured to access the recovered selected SLC page from the non-volatile memory cells during a fine programming phase of the process of folding the SLC data to the MLC data. The control circuit is configured to use the recovered selected SLC page during the fine programming phase of folding the SLC data to the MLC data.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   volatile memory;
   a memory interface configured to be connected to non-volatile memory; and
   a processor circuit connected to the memory interface and coupled to the volatile memory, the processor circuit configured to:
   read a selected unit of encoded single level cell (SLC) data from a first group of non-volatile memory cells in the non-volatile memory into the volatile memory during a first programming phase of a process of folding data stored at a single bit per memory cell in the non-volatile memory to data stored at multiple bits per memory cell in the non-volatile memory;
   recover the selected unit of SLC data based on a plurality of other units of SLC data and redundancy data formed from the selected unit of SLC data and the plurality of other units of SLC data in response to a failure to decode the selected unit of encoded SLC data;
   save the recovered selected unit of SLC data to memory; and
   use the saved recovered unit of SLC data during a second programming phase of folding the data stored at a single bit per memory cell in the non-volatile memory to the data stored at multiple bits per memory cell in the non-volatile memory.

2. The apparatus of claim 1, wherein:
   the processor circuit comprises an error correction engine configured to determine whether the selected unit of encoded SLC data can be recovered by applying an error correcting algorithm to the encoded SLC data; and
   the processor circuit is configured to save the recovered selected unit of SLC data to volatile memory coupled to the error correction engine.

3. The apparatus of claim 1, wherein:
   the processor circuit is configured to save the recovered selected unit of SLC data to a second group of non-volatile memory cells in the non-volatile memory.

4. The apparatus of claim 1, wherein:
   the processor circuit is configured to save the recovered selected unit of SLC data to a region of the non-volatile memory that is used as a safe zone.

5. The apparatus of claim 1, wherein:
   the processor circuit is configured to save the recovered selected unit of SLC data to an open block of non-volatile memory cells in the non-volatile memory.

6. The apparatus of claim 1, wherein:
   the first programming phase of the folding comprises a coarse programming phase; and
   the second programming phase of the folding comprises a fine programming phase.

7. The apparatus of claim 1, wherein the processor circuit is further configured to:
store the data at multiple bits per memory cell in a first word line in a block of non-volatile memory cells in the non-volatile memory during the first programming phase of the process of folding the data; and
perform the second programming phase of the process of folding the data after programming data to a second word line in the block of non-volatile memory cells in the non-volatile memory.

8. A method of operating non-volatile storage, the method comprising:
reading, from a first group of non-volatile memory cells, a codeword for a selected single level cell (SLC) page of data during a coarse programming phase of folding SLC data stored at a single bit per non-volatile memory cell to multi-level cell (MLC) data stored at multiple bits per non-volatile memory cell;
applying an error correcting algorithm to the codeword for the selected SLC page during the coarse programming phase;
determining that the selected SLC page is not recovered by applying the error correcting algorithm to the codeword for the selected SLC page during the coarse programming phase;
recovering the selected SLC page using a redundancy page and a plurality of SLC pages other than the selected SLC page, the redundancy page comprising bitwise combinations of the selected SLC page and the plurality of SLC pages other than the selected SLC page;
saving the recovered selected SLC page to a second group of non-volatile memory cells;
reading, from the first group of non-volatile memory cells, the codeword for the selected SLC page during a fine programming phase of folding the SLC data to the MLC data;
applying the error correcting algorithm to the codeword for the selected SLC page during the fine programming phase; and
using the saved recovered selected SLC page during the fine programming phase of folding the SLC data to the MLC data in response to a failure to decode the codeword for the selected SLC page during the fine programming phase.

9. The method of claim 8, further comprising:
forming the redundancy page from bitwise combinations of the selected SLC page and the plurality of SLC pages other than the selected SLC page; and
storing the redundancy page in the non-volatile storage.

10. The method of claim 8, wherein saving the recovered selected SLC page to memory comprises:
saving the recovered selected SLC page to non-volatile memory cells that store one bit per memory cell.

11. The method of claim 8, wherein saving the recovered selected SLC page to memory comprises:
saving the recovered selected SLC page to a block of non-volatile memory cells that are reserved for storing information for managing operation of the non-volatile storage.

12. The method of claim 8, wherein saving the recovered selected SLC page to memory comprises:
saving the recovered selected SLC page to an open block of non-volatile memory cells.

13. The method of claim 8, further comprising:
storing the MLC data at multiple bits per memory cell in a first word line of a block of the non-volatile memory cells in the non-volatile storage during the coarse programming phase of folding the SLC data to the MLC data; and
performing the fine programming phase of folding the SLC data to the MLC data after programming data to a second word line in the block of non-volatile memory cells.

14. A non-volatile storage device comprising:
non-volatile memory cells; and
a control circuit configured to:
read a codeword for a selected single level cell (SLC) page in a first block of the non-volatile memory cells during a coarse programming phase of a process of folding SLC data stored at a single bit per memory cell to multi-level cell (MLC) data stored at multiple bits per memory cell in a first word line of a second block of the non-volatile memory cells;
recover the selected SLC page using a page of XOR data formed from a plurality of SLC pages stored in the non-volatile memory cells, the plurality of SLC pages include the selected SLC page;
store the recovered selected SLC page to data latches;
use the recovered selected SLC page in the data latches to perform the coarse programming phase of folding the SLC data to the first word line in the second block;
save the recovered selected SLC page to a third block of the non-volatile memory cells;
perform a coarse programming phase of programing MLC data to a second word line in the second block after performing the coarse programming phase of folding the SLC data to the first word line in the second block, including overwrite the recovered selected SLC page in the data latches;
access the recovered selected SLC page from the third block of the non-volatile memory during a fine programming phase of the process of folding the SLC data to the MLC data, wherein the fine programming phase is performed after the coarse programming phase of the second word line in the second block; and
use the recovered selected SLC page during the fine programming phase to fold the SLC data to the MLC data.

15. The non-volatile storage device of claim 14, wherein:
the control circuit comprises a memory controller configured to determine whether the codeword for the selected SLC page can be decoded by applying an error correcting algorithm to the codeword for the selected SLC page, the memory controller is configured to recover the selected SLC page using the page of XOR data in response to determining that the codeword for the selected SLC page cannot be decoded by applying the error correcting algorithm.

16. The non-volatile storage device of claim 14, wherein:
the control circuit is configured to save the recovered selected SLC page to a group of the non-volatile memory cells that store data at a single bit per memory cell.

17. The non-volatile storage device of claim 14, wherein:
the control circuit is configured to save the recovered selected SLC page to a group of the non-volatile memory cells that are used as a safe zone.

18. The non-volatile storage device of claim 14, wherein:
the control circuit is configured to save the recovered selected SLC page to a group of the non-volatile memory cells that comprise an open block of non-volatile memory cells.

\* \* \* \* \*